United States Patent
Chiu et al.

(10) Patent No.: US 12,010,924 B2
(45) Date of Patent: Jun. 11, 2024

(54) METHOD FOR MANUFACTURING SEMICONDUCTOR STRUCTURE WITH MEMORY DEVICE

(71) Applicant: Taiwan Semiconductor Manufacturing Company, Ltd., Hsinchu (TW)

(72) Inventors: Chih-Pin Chiu, Hsinchu (TW); Chang-Lin Yang, Hsinchu (TW); Chien-Hua Huang, Toufen Township, Miaoli County (TW); Chen-Chiu Huang, Taichung (TW); Chih-Fan Huang, Kaohsiung (TW); Dian-Hau Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 344 days.

(21) Appl. No.: 17/205,213

(22) Filed: Mar. 18, 2021

(65) Prior Publication Data
US 2022/0302375 A1  Sep. 22, 2022

(51) Int. Cl.
*H10N 50/10* (2023.01)
*H10B 61/00* (2023.01)
(Continued)

(52) U.S. Cl.
CPC ............. *H10N 50/10* (2023.02); *H10B 61/00* (2023.02); *H10N 50/01* (2023.02); *H10N 50/80* (2023.02); *H10N 50/85* (2023.02)

(58) Field of Classification Search
CPC ........ H10N 50/10; H10N 50/01; H10N 50/80; H10N 50/85; H10B 61/00; H10B 61/20;
(Continued)

(56) References Cited

U.S. PATENT DOCUMENTS

| 8,975,089 B1 * | 3/2015 | Jung | H10N 50/01 |
| | | | 257/295 |
| 9,570,670 B2 * | 2/2017 | Park | H10N 50/10 |

(Continued)

FOREIGN PATENT DOCUMENTS

| CN | 113053712 A | * | 6/2021 | ........ H01J 37/32449 |
| CN | 113053712 A | * | 6/2021 | .......... H01J 37/3244 |

*Primary Examiner* — William B Partridge
*Assistant Examiner* — David Paul Sedorook
(74) *Attorney, Agent, or Firm* — Birch, Stewart, Kolasch & Birch, LLP

(57) ABSTRACT

Semiconductor structures and methods for manufacturing the same are provided. The method includes forming a bottom electrode layer over a substrate and forming a pinned layer over the bottom electrode layer. The method also includes forming a tunnel barrier layer over the pinned layer and forming a free layer over the tunnel barrier layer. The method also includes patterning the free layer, the tunnel barrier layer, and the pinned layer to form a magnetic tunnel junction (MTJ) stack structure and patterning the bottom electrode layer to form a bottom electrode structure under the MTJ stack structure. In addition, patterning the free layer includes using a first etching gas, and patterning the bottom electrode layer includes using a second etching gas, which is different from the first etching gas.

20 Claims, 22 Drawing Sheets

(51) Int. Cl.
  *H10N 50/01* (2023.01)
  *H10N 50/80* (2023.01)
  *H10N 50/85* (2023.01)

(58) Field of Classification Search
  CPC ....... H01L 43/08; H01L 43/12; H01L 27/222; H01L 27/226
  See application file for complete search history.

(56) References Cited

U.S. PATENT DOCUMENTS

| | | | |
|---|---|---|---|
| 10,790,439 B2 * | 9/2020 | Ku ..................... | H01F 10/3254 |
| 2004/0137749 A1 * | 7/2004 | Ying ................... | H10N 50/01 |
| | | | 257/E21.311 |
| 2009/0255805 A1 * | 10/2009 | Hanyu ................. | B23K 17/00 |
| | | | 204/192.34 |
| 2010/0214694 A1 * | 8/2010 | Kimura ................ | G11B 5/746 |
| 2013/0146997 A1 * | 6/2013 | Lee ..................... | H10N 50/01 |
| | | | 257/E27.005 |
| 2014/0080227 A1 * | 3/2014 | Tomioka ............. | H01L 21/31105 |
| | | | 438/3 |
| 2015/0044781 A1 * | 2/2015 | Tokashiki ............ | H10N 50/01 |
| | | | 438/3 |
| 2017/0062709 A1 * | 3/2017 | Kim .................... | H10N 50/80 |
| 2017/0125668 A1 * | 5/2017 | Paranjpe ............. | H10N 50/80 |
| 2020/0066972 A1 * | 2/2020 | Yang ................... | H01F 10/3254 |
| 2020/0106009 A1 * | 4/2020 | Wu ..................... | G11C 11/161 |
| 2020/0176041 A1 * | 6/2020 | Shen ................... | H10N 50/01 |
| 2022/0029091 A1 * | 1/2022 | Wang .................. | H10N 50/85 |
| 2022/0131071 A1 * | 4/2022 | Lill ..................... | H10N 50/01 |
| 2022/0199898 A1 * | 6/2022 | Hashemi ............. | H01F 10/3254 |

\* cited by examiner

METHOD FOR MANUFACTURING SEMICONDUCTOR STRUCTURE WITH MEMORY DEVICE

BACKGROUND

The electronics industry is experiencing ever-increasing demand for smaller and faster electronic devices that are able to perform a greater number of increasingly complex and sophisticated functions. Accordingly, there is a continuing trend in the semiconductor industry to manufacture low-cost, high-performance, and low-power integrated circuits (ICs). So far, these goals have been achieved in large part by scaling down semiconductor IC dimensions (e.g., minimum feature size) and thereby improving production efficiency and lowering associated costs. However, such miniaturization has introduced greater complexity into the semiconductor manufacturing process. Thus, the realization of continued advances in semiconductor ICs and devices calls for similar advances in semiconductor manufacturing processes and technology.

Recently, magnetic random-access memory (MRAM) is being used in IC devices. MRAM offers comparable performance to volatile static random-access memory (SRAM), and has a comparable density and lower power consumption than volatile dynamic random-access memory (DRAM). Although existing approaches to MRAM device formation have generally been adequate for their intended purposes, they have not been entirely satisfactory in all respects.

BRIEF DESCRIPTION OF THE DRAWINGS

Aspects of the present disclosure are best understood from the following detailed description when read with the accompanying Figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1A:
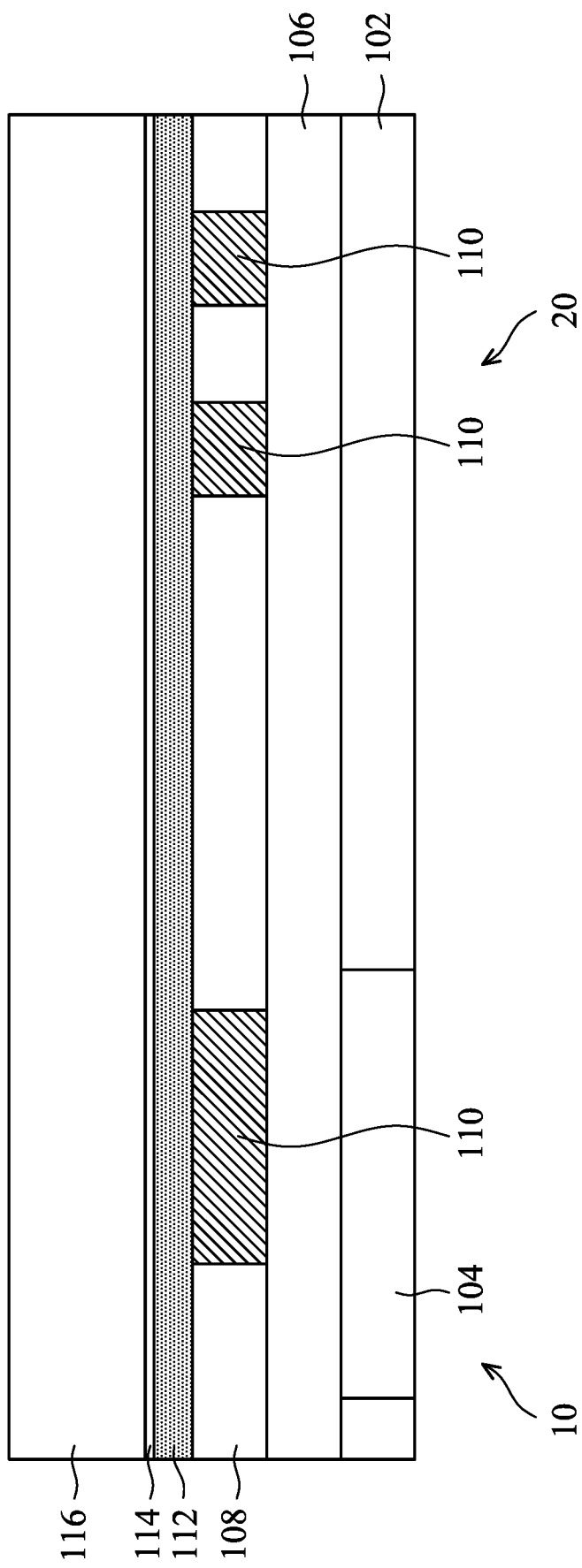
FIGS. 1A to 1Q illustrate cross-sectional representations of various stages of manufacturing a semiconductor structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numerals are used to designate like elements. It should be understood that additional operations can be provided before, during, and after the method, and some of the operations described can be replaced or eliminated for other embodiments of the method.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. In addition, the terms may be varied in different technologies and be in the deviation range understood by the skilled in the art. For example, when used in conjunction with a numerical value, the terms can refer to a range of variation of less than or equal to ±10% of that numerical value, though the present application is not limited thereto. The terms in relation to a numerical value x may mean x±3%, ±5% or ±10% of what is specified, though the present invention is not limited thereto.

Embodiments of semiconductor structures and methods for forming the same are provided. The semiconductor structures may include magnetic random-access memory devices (or MRAM cells), and the MRAM devices may include a magnetic tunnel junction (MTJ) stack. The MTJ stack may be formed by patterning a pinned layer, a tunnel barrier layer, and a free layer, and an etching gas used in the patterning process may be chosen according to the materials that the MTJ stack are made of. By using the chosen etching gas, the etching efficiency may be improved and the damage of the material layers in the MTJ stack due to the etching process may be reduced.

Figure 1B:
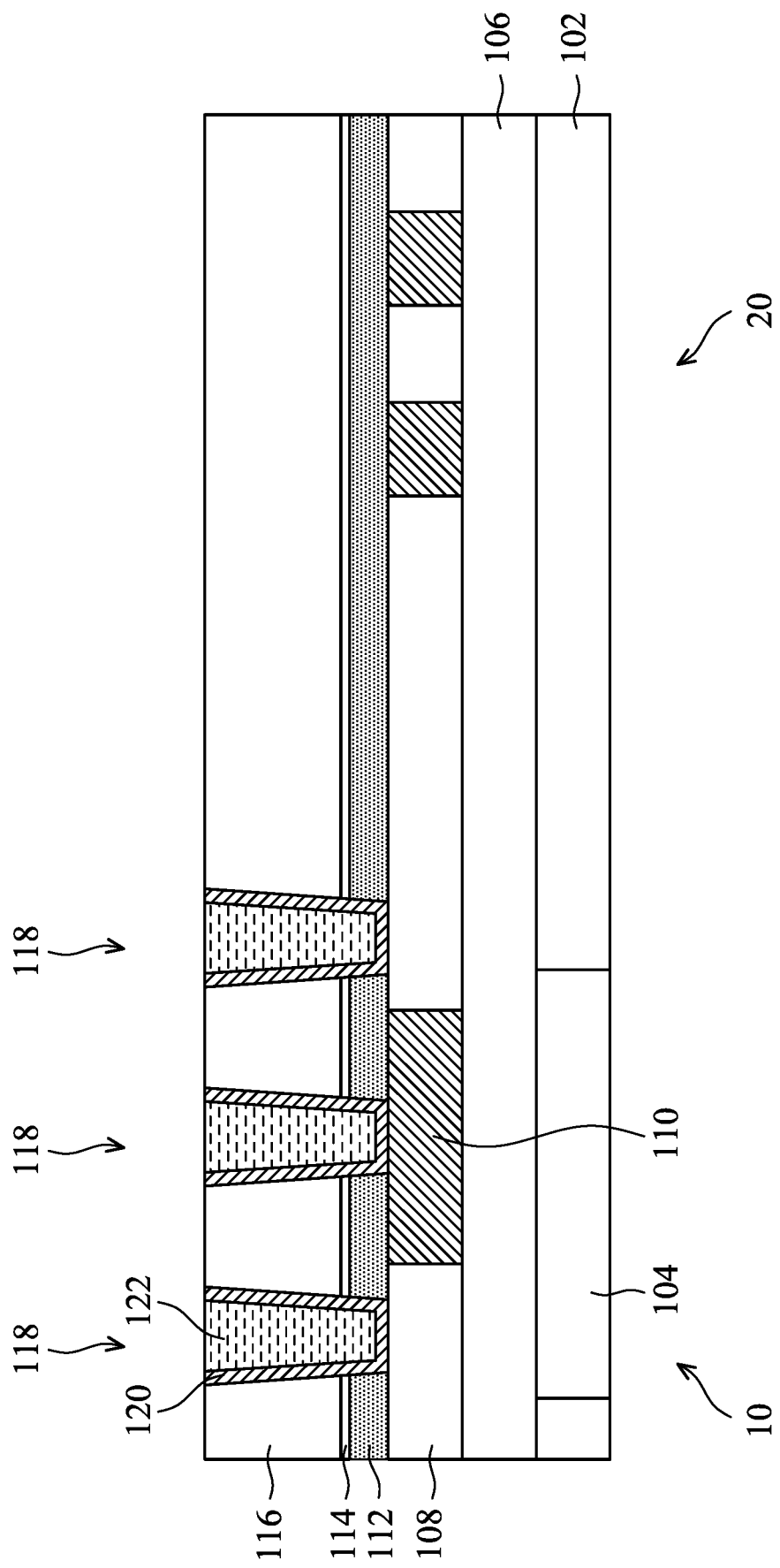
Figure 1C:
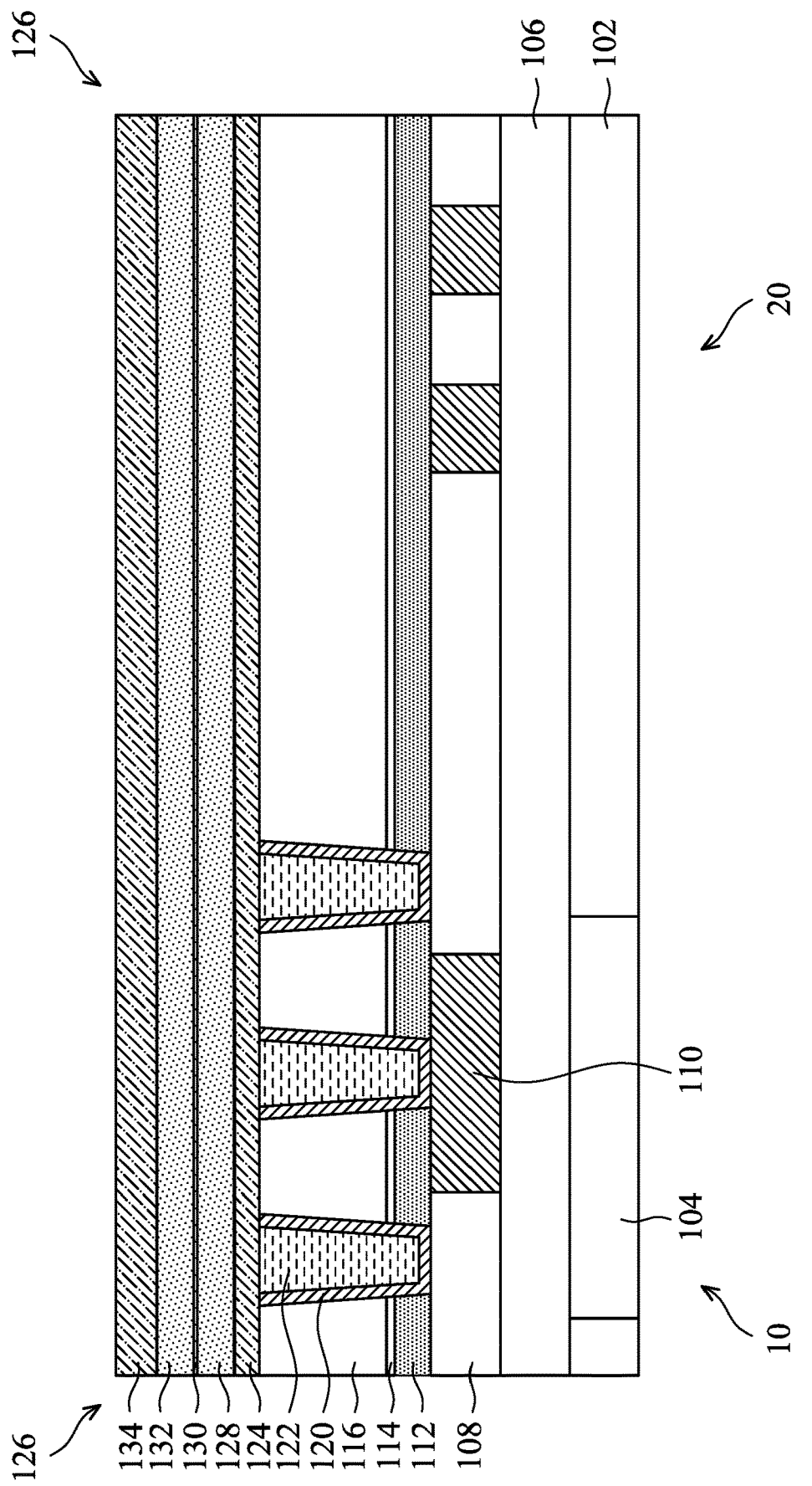
Figure 1D:
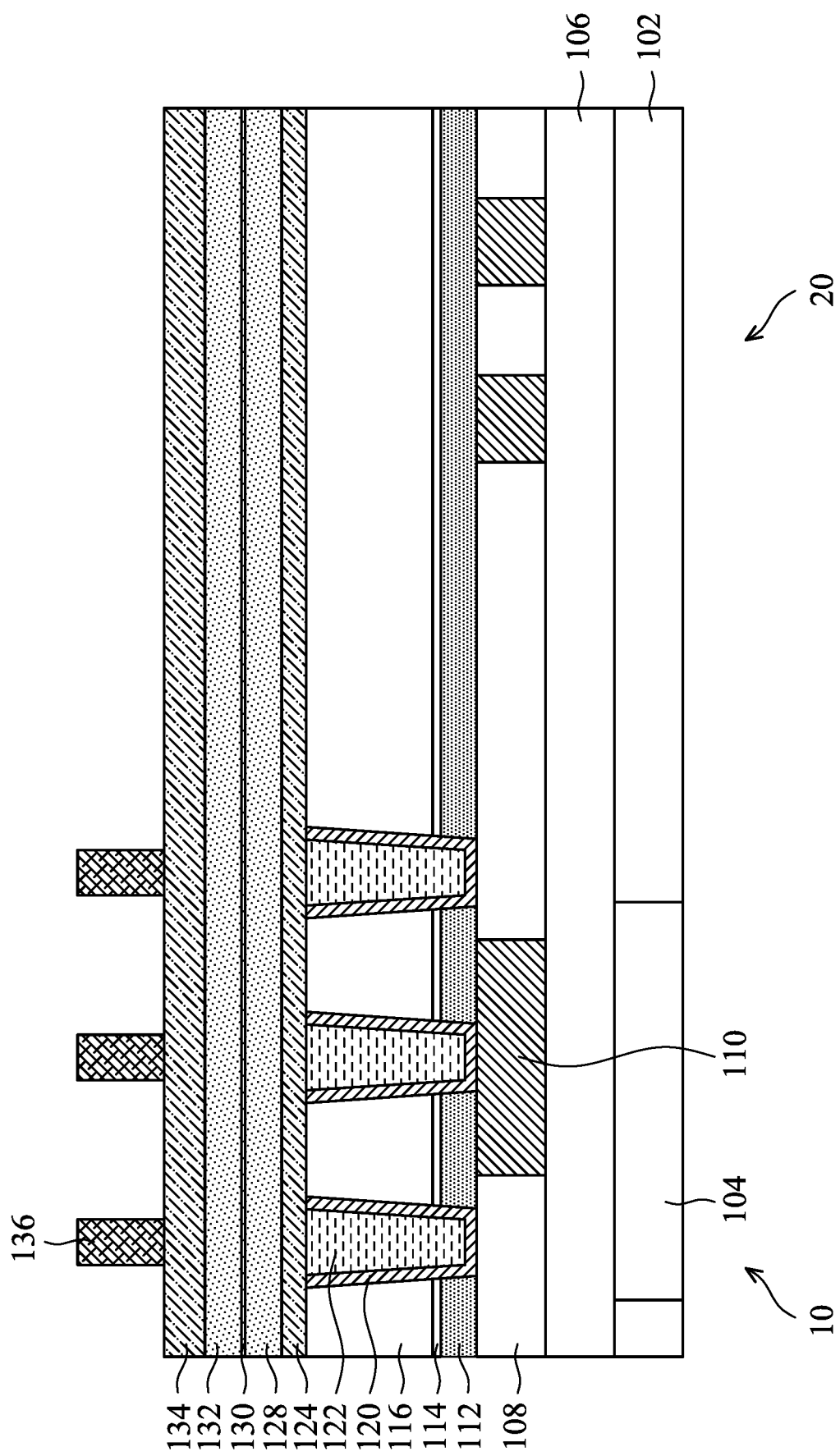
Figure 1E:
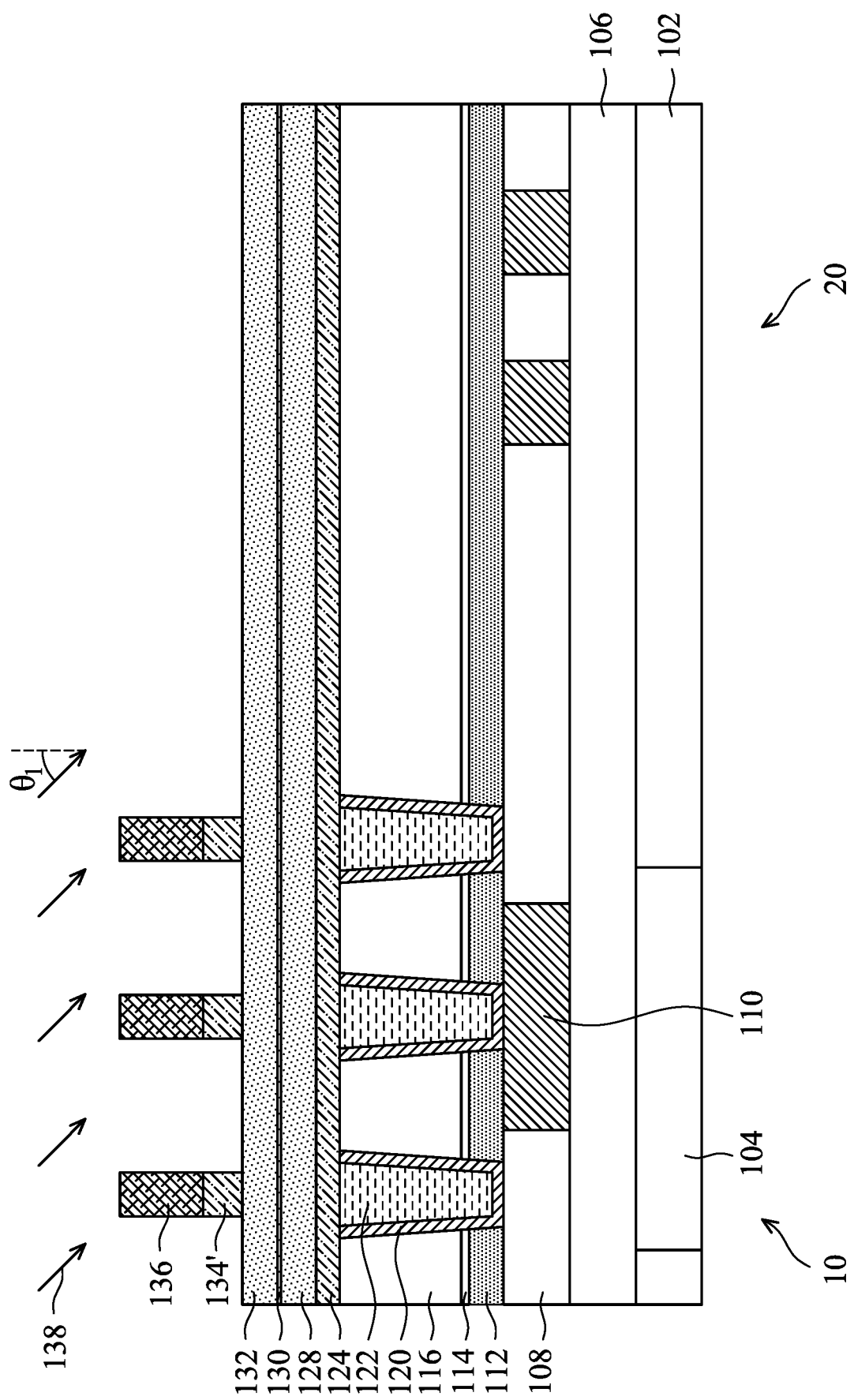
Figure 1F:
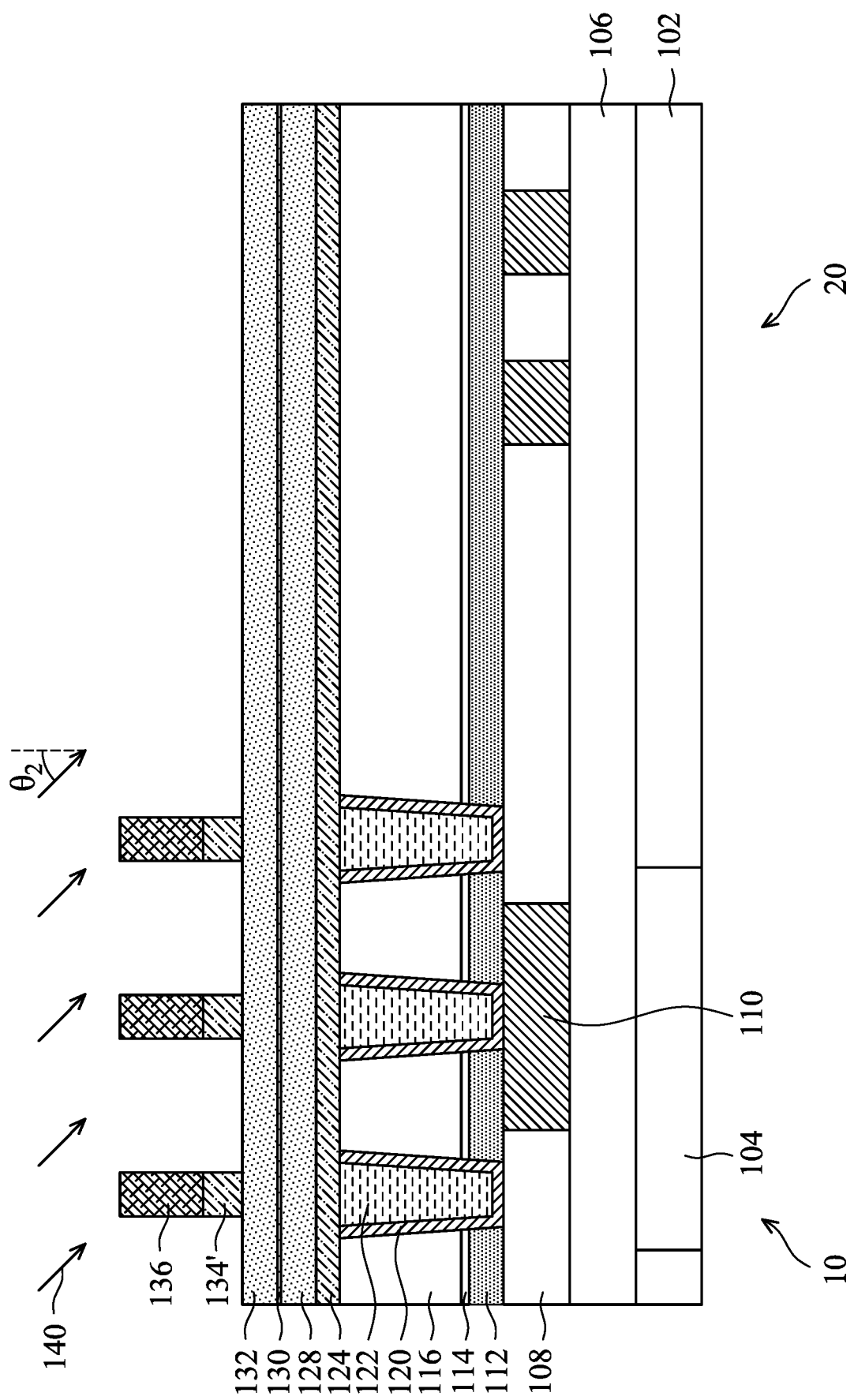
Figure 1G:
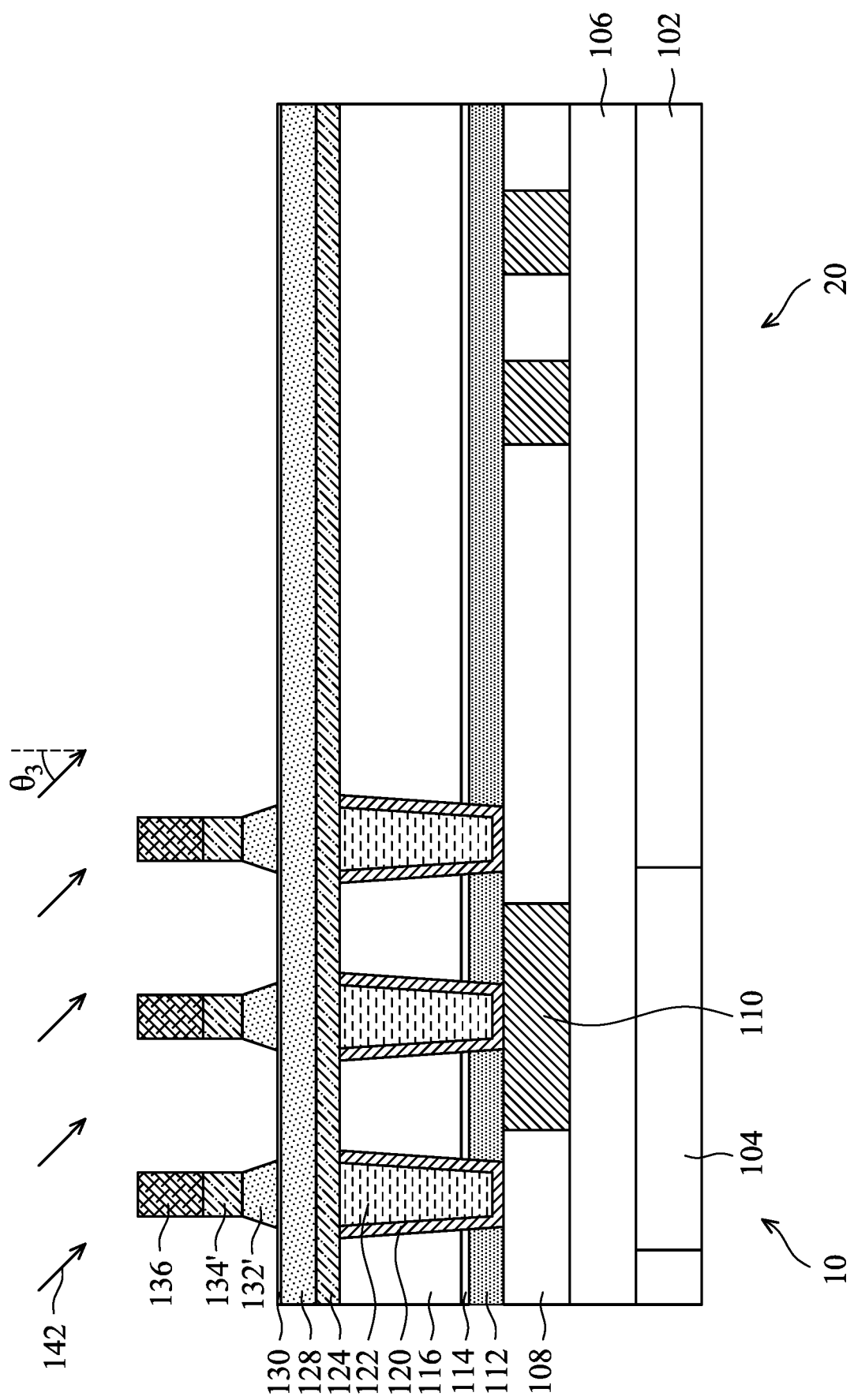
Figure 1H:
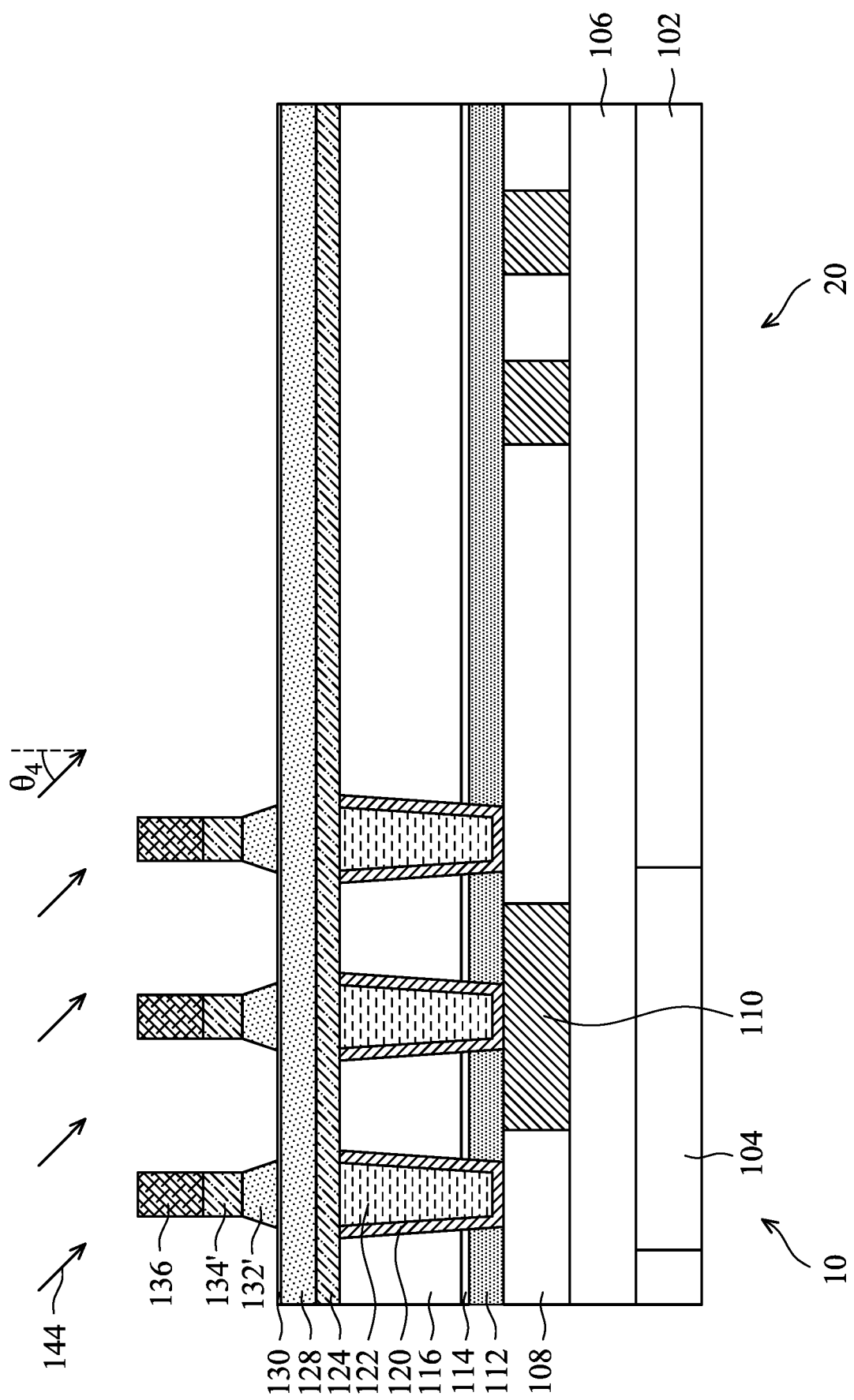
Figure 1I:
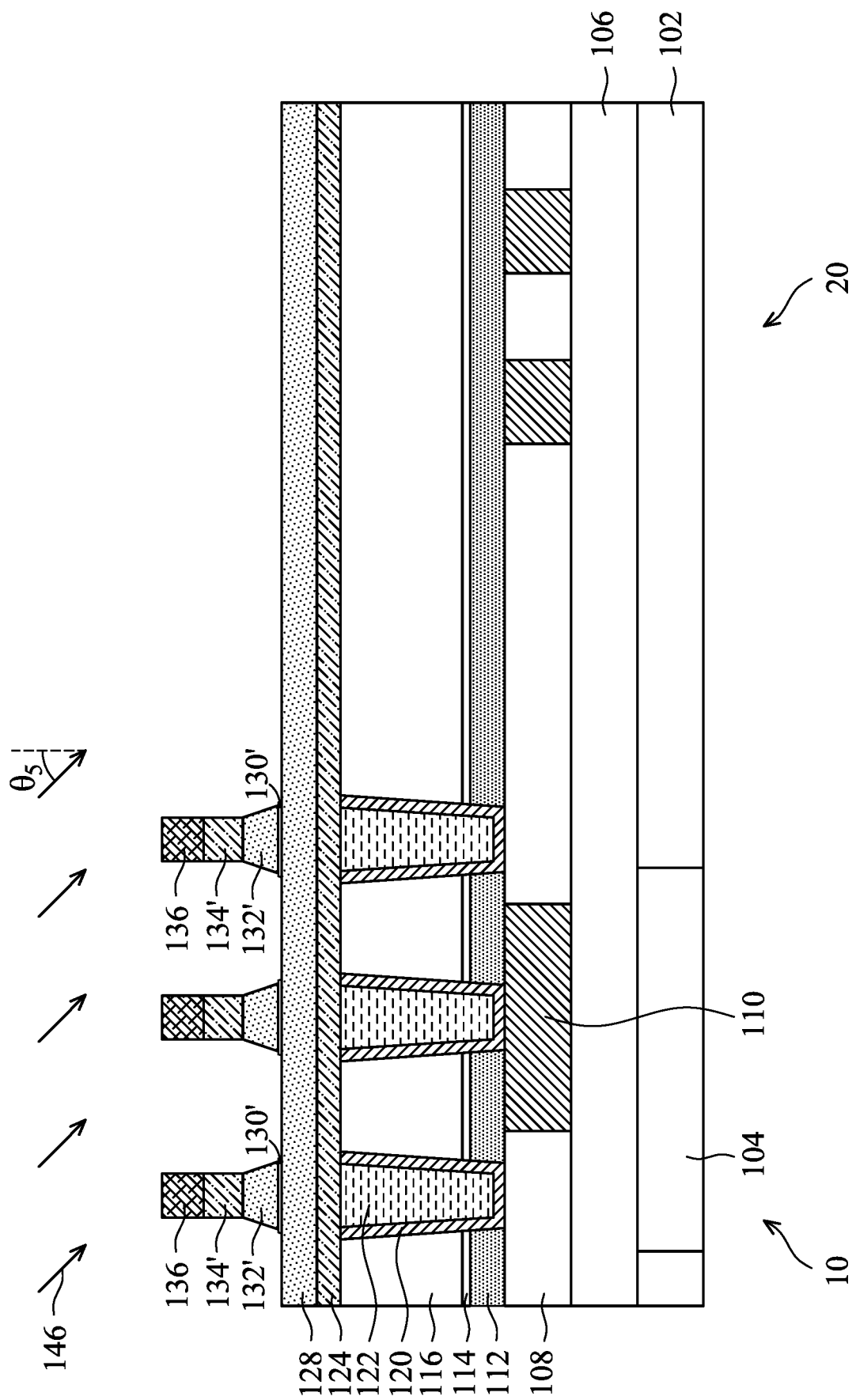
Figure 1J:
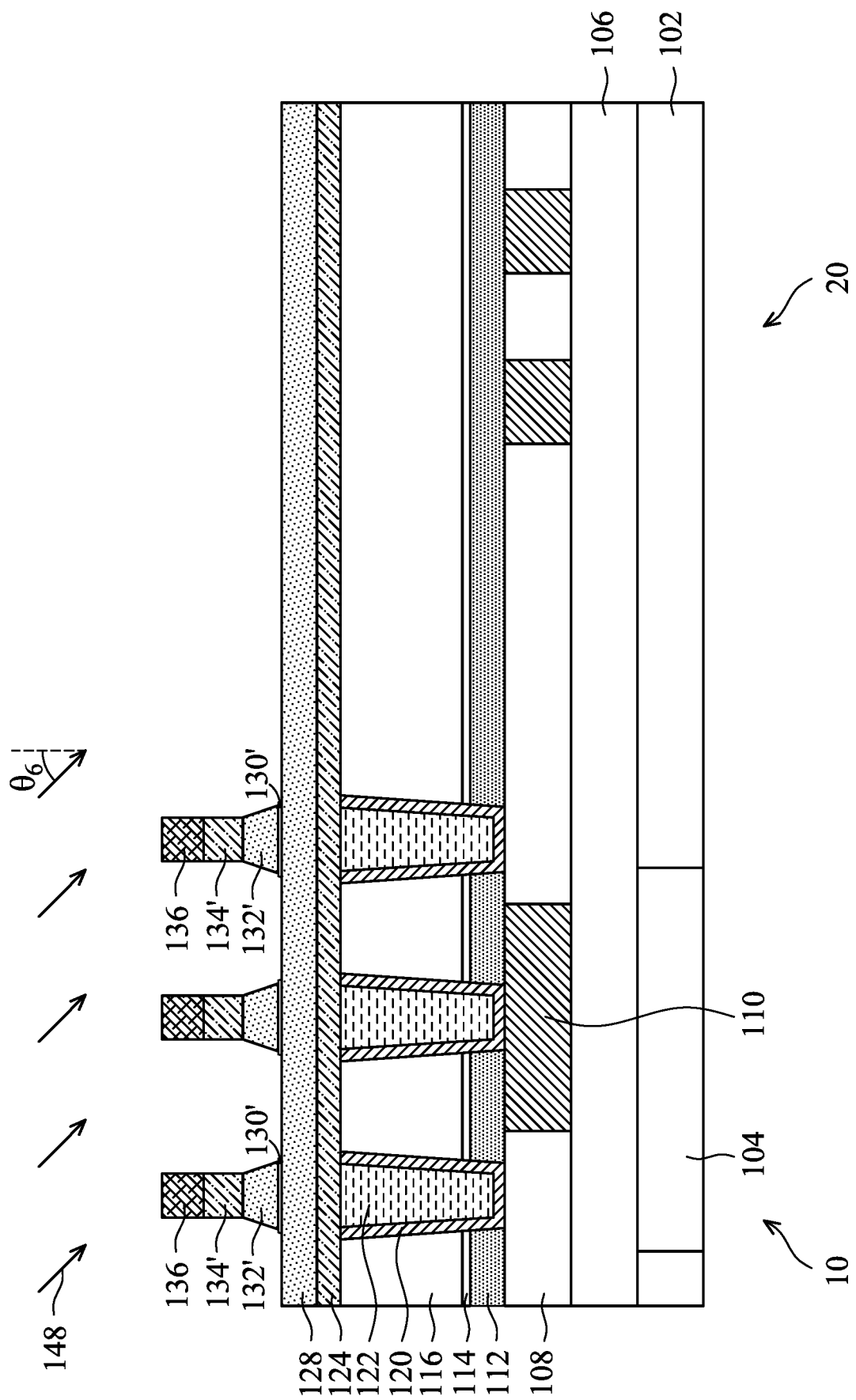
Figure 1K:
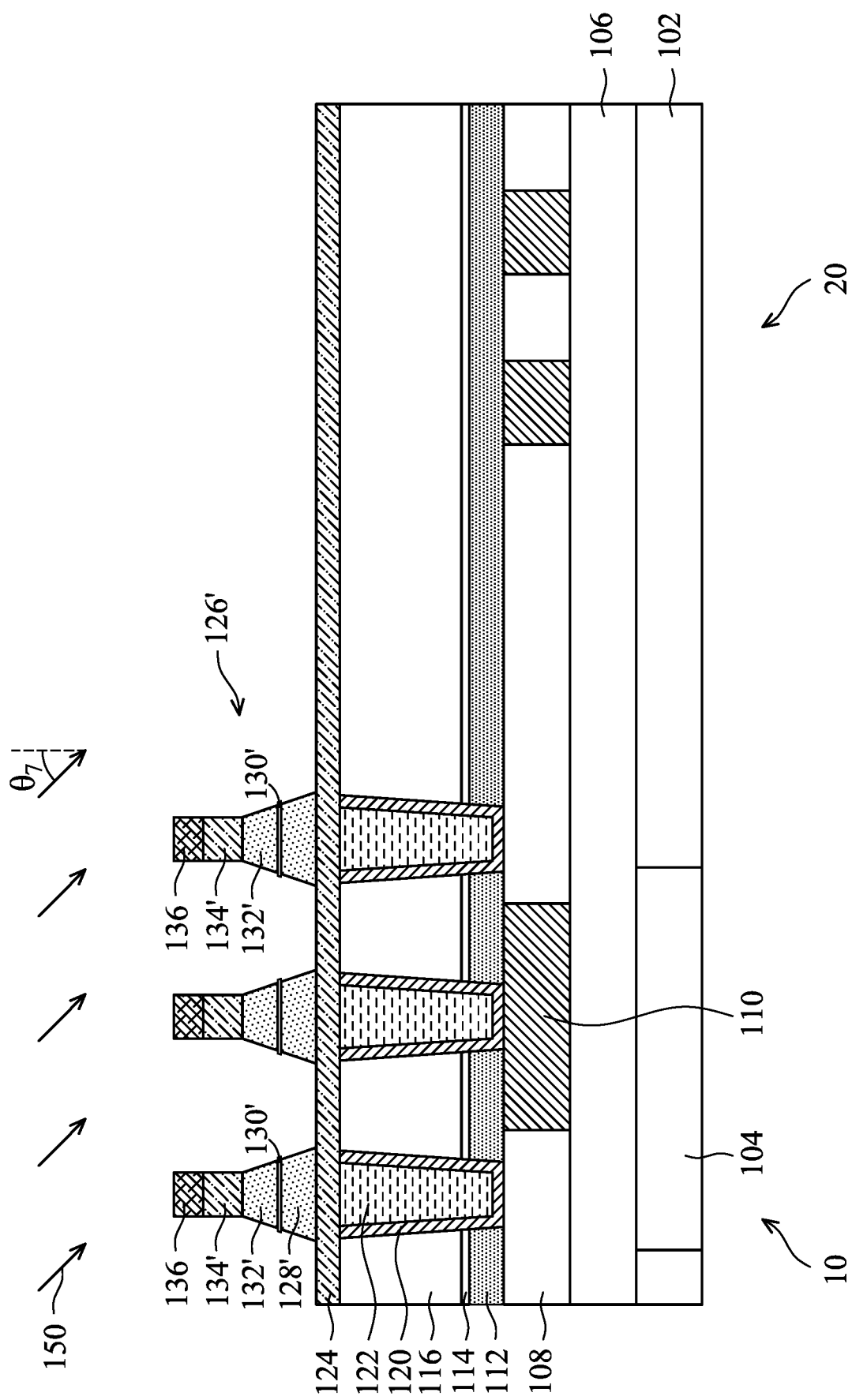
Figure 1L:
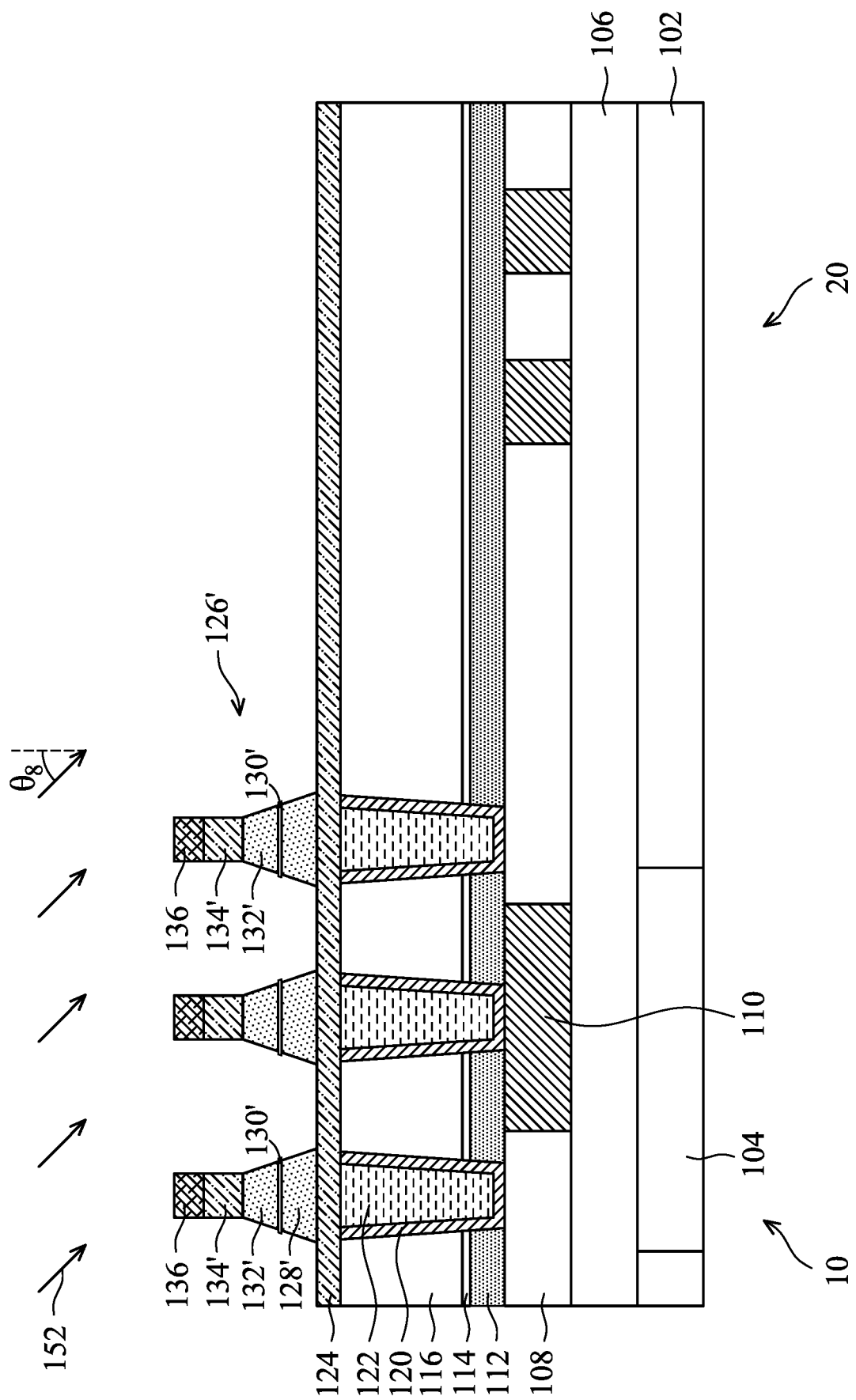
Figure 1M:
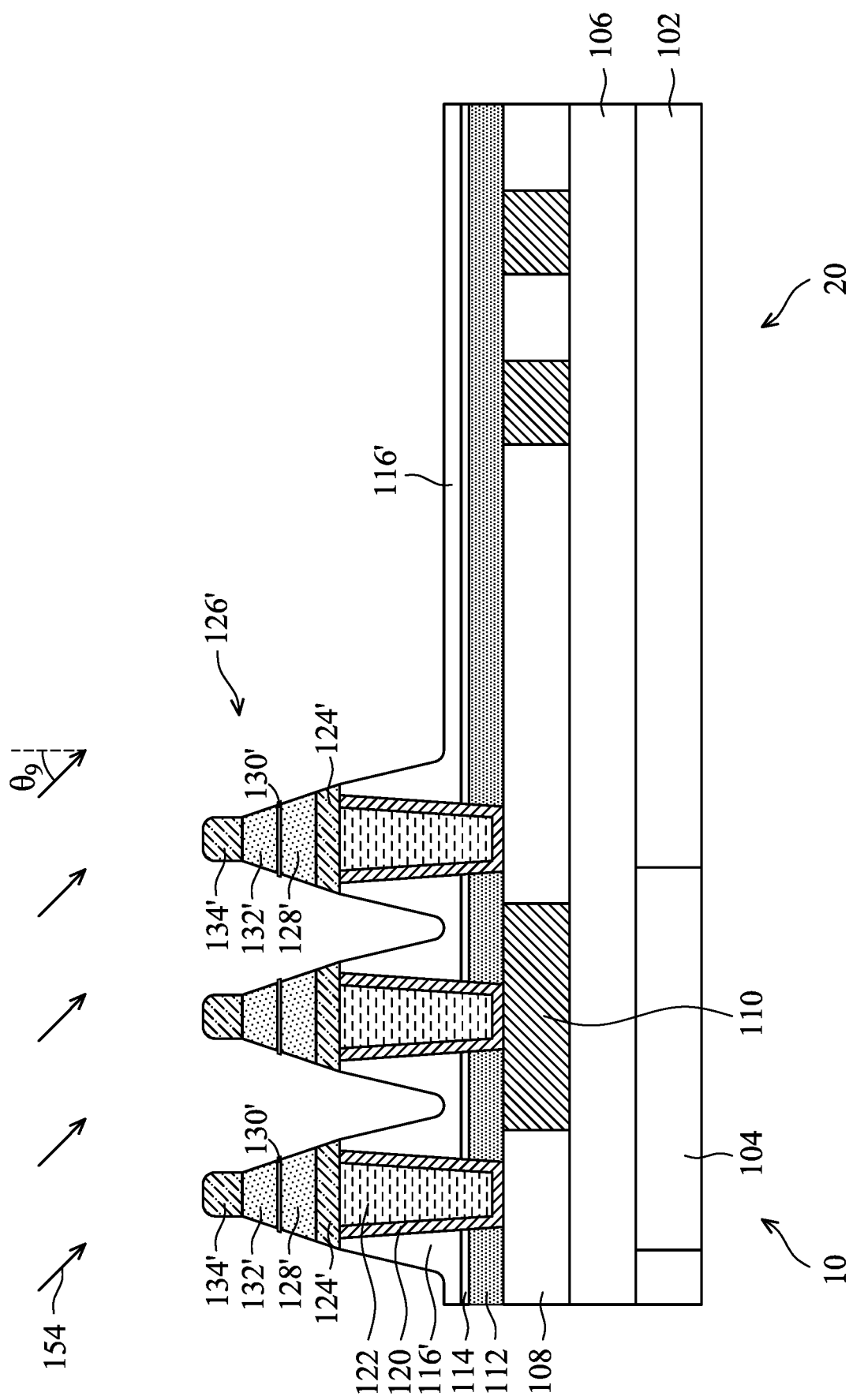
Figure 1N:
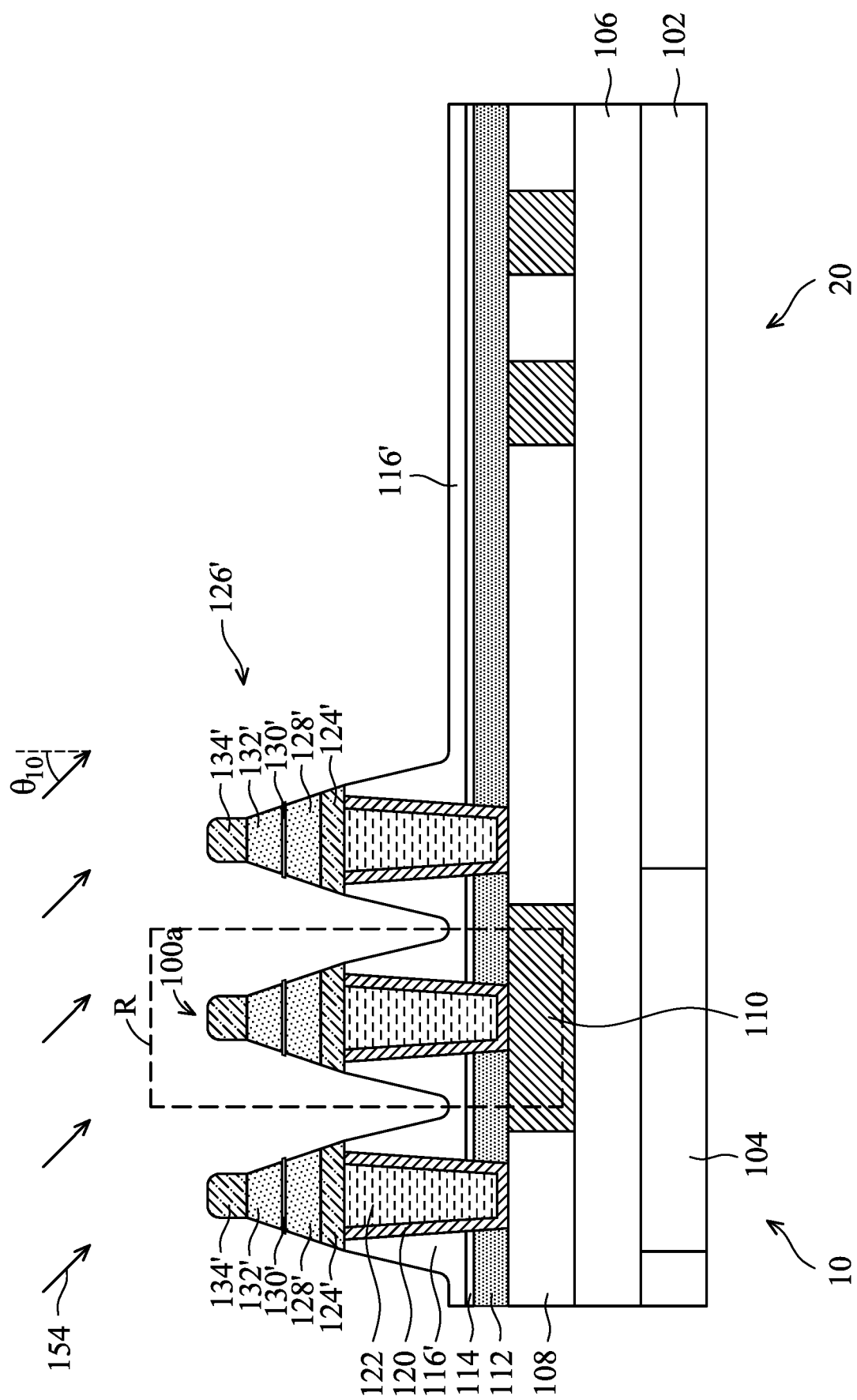
Figure 1O:
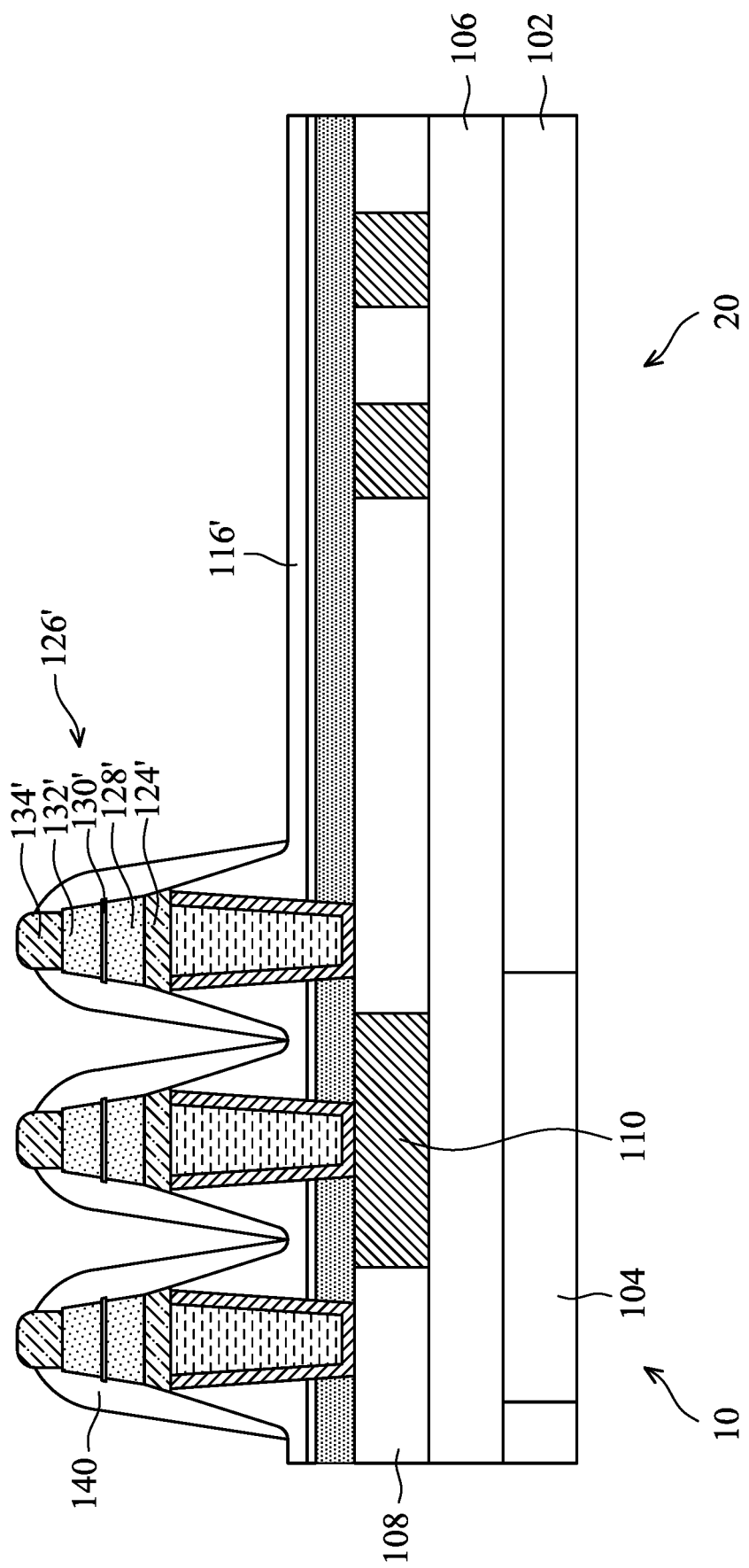
Figure 1P:
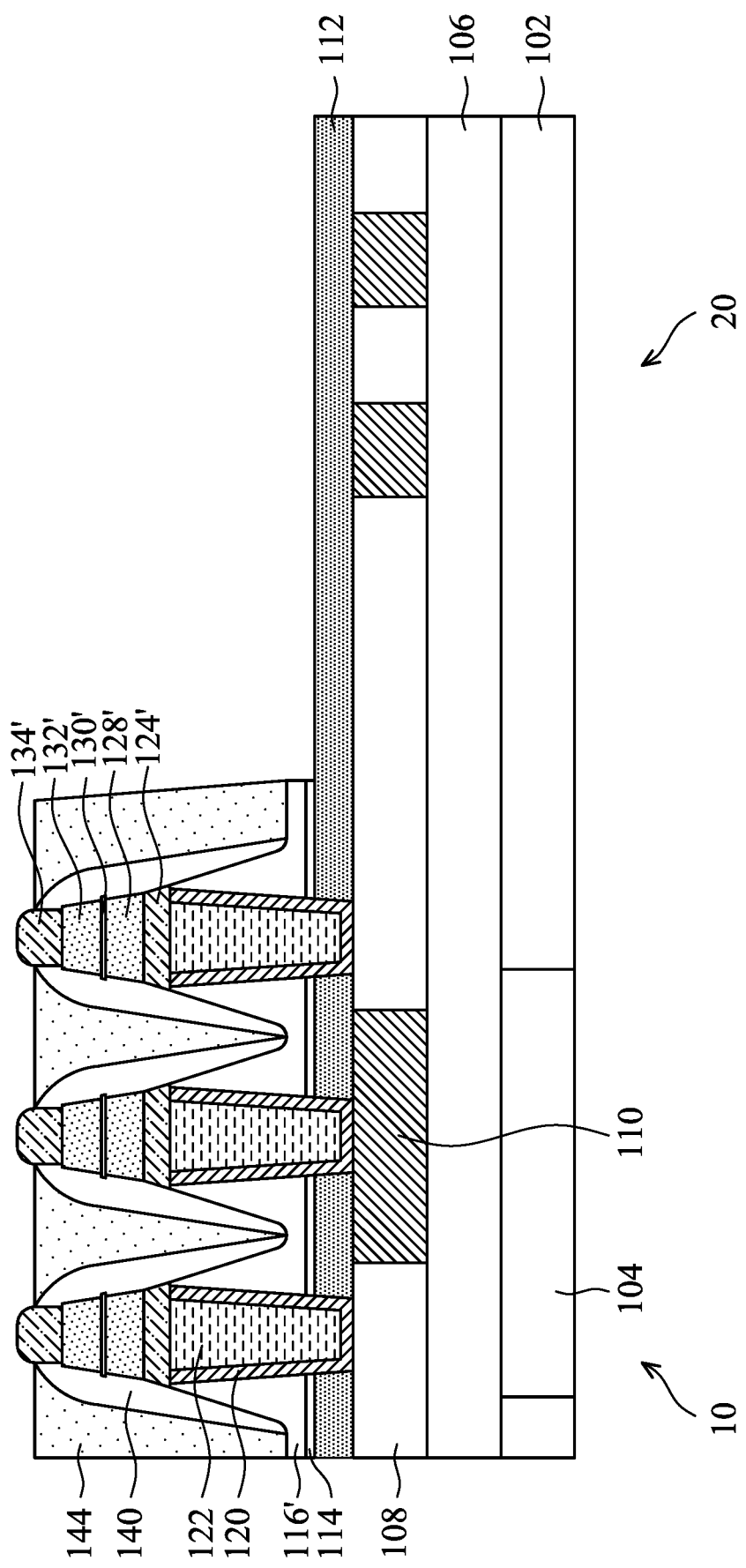
Figure 1Q:
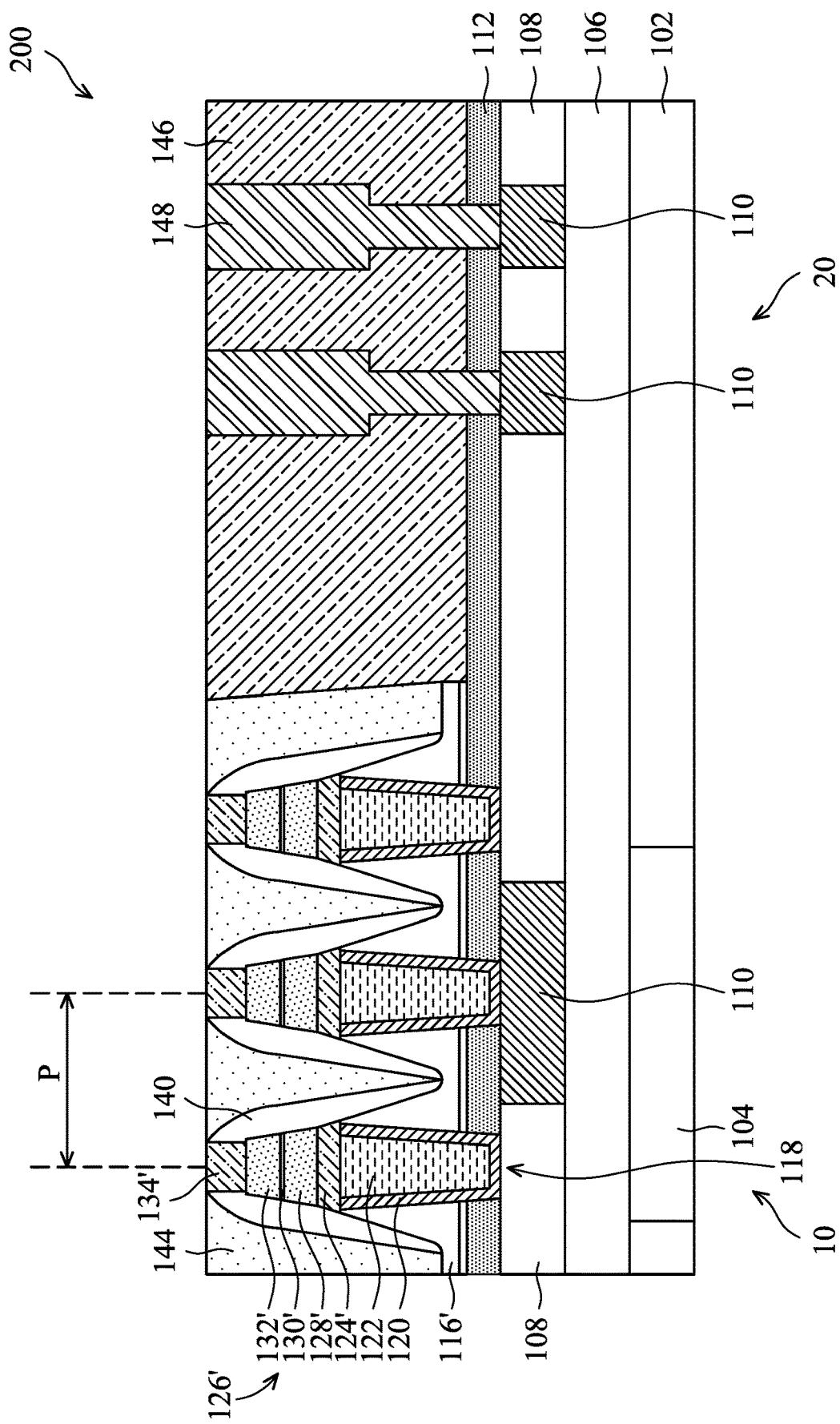

FIGS. 1A to 1Q illustrate cross-sectional representations of various stages of manufacturing a semiconductor structure 200 in accordance with some embodiments. As shown in FIG. 1A, a substrate 102 is formed, and the substrate 102 includes a MRAM region 10 and a logic region 20 in accordance with some embodiments. The MRAM region 10 may be configured to have MRAM devices formed over it and the logic region 20 may be configured to have logic devices formed over it. The logic devices formed in the logic region 20 may be used for implementing write-read logic for accessing MRAM devices and/or performing other functions. The logic region 20 may occupy most of the area of the semiconductor structure. For example, the logic region 30 may occupy from 95% to 99% of the area of the semiconductor structure, with the memory region 10 occupying the remaining area of the semiconductor structure. The memory region 10 can be disposed at an edge of the logic region 20, or the logic region 20 can surround the memory region 10.

The substrate 102 may be a semiconductor wafer such as a silicon wafer. Alternatively or additionally, the substrate 102 may include elementary semiconductor materials, compound semiconductor materials, and/or alloy semiconductor materials. Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

In addition, the substrate 102 may include structures such as doped regions, interlayer dielectric (ILD) layers, conductive features, and/or isolation structures. Furthermore, the substrate 102 may further include single or multiple material layers to be patterned. For example, the material layers may include a silicon layer, a dielectric layer, and/or a doped poly-silicon layer.

In some embodiments, the substrate 102 includes a device region 104, as shown in FIG. 1A. The device region 104 may have various device elements. Examples of device elements may include, but are not limited to, transistors, diodes, and other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and other applicable processes.

An interconnect structure 106 is formed over the substrate 102, as shown in FIG. 1A in accordance with some embodiments. The interconnect structure 106 may include multiple metallization layers (not shown), and each of the metallization layers includes metallization patterns in dielectric layers. The metallization patterns may be electrically coupled to the devices in the substrate 102, and include, respectively, metal lines and metal vias formed in one or more inter-metal dielectric (IMD) layers. The interconnect structure 108 may formed by damascene processes, such as a single damascene process, a dual damascene process, or the like.

An inter-metal dielectric layer 108 is formed over the interconnect structure 106, and conductive features 110 are formed in the inter-metal dielectric layer 118, as shown in FIG. 1A in accordance with some embodiments.

In some embodiments, the inter-metal dielectric layer 108 is made of any applicable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The inter-metal dielectric layer 108 may be formed by any applicable deposition process, such as spin coating, physical vapor deposition (PVD), chemical vapor deposition (CVD), the like, or a combination thereof. The inter-metal dielectric layer 110 may be a layer made of a low-k dielectric material having a k-value lower than about 3.0. The inter-metal dielectric layer 108 may be a layer made of an extra-low-k (ELK) dielectric material having a k-value of less than 2.5.

The conductive features 110 formed in the inter-metal dielectric layer 108 may be electrically connected to the devices formed in the device region. The conductive features 110 may be formed by forming trenches in the inter-metal dielectric layer 108 by performing an etching process, and the trenches may expose underlying conductive features, such as underlying metal vias. Diffusion barrier layers (not shown) and the conductive materials may be formed in the trenches to form the conductive features 110.

The diffusion barrier layers may be made of TaN, Ta, TiN, Ti, CoW, or the like, and may be formed in the trenches by a deposition process such as atomic layer deposition (ALD) or the like. The conductive material may include copper, aluminum, tungsten, silver, and combinations thereof, or the like, and may be formed over the diffusion barrier layers in the trenches by an electro-chemical plating process, CVD, ALD, PVD, the like, or a combination thereof. In some embodiments, the conductive material is copper, and the diffusion barrier layers are thin barrier layers that prevent the copper from diffusing into the inter-metal dielectric layer 108. After formation of the diffusion barrier layers and the conductive material, excess of the diffusion barrier layers and conductive material may be removed by, for example, a planarization process such as a chemical mechanical polish (CMP) process. In some embodiments, the conductive features 110 are metal lines.

One or more etch stop layer(s) may be formed over the conductive features 110 and the inter-metal dielectric layer 108. In some embodiments, a first etch stop layer 112 and a second etch stop layer 114 are formed over the inter-metal dielectric layer 108, as shown in FIG. 1A in accordance with some embodiments. The first etch stop layer 112 and the second etch stop layer 114 may be formed of dielectric materials such as aluminum nitride, aluminum oxide, silicon oxide, silicon nitride, silicon oxynitride, silicon carbide, a combination thereof, or the like. The first etch stop layer 112 and the second etch stop layer 114 may be formed by chemical vapor deposition (CVD), physical vapor deposition (PVD), ALD, a spin-on-dielectric process, the like, or a combination thereof. The etch stop layer(s) may also be a composite layer formed of a plurality of dielectric layers.

In some embodiments, the first etch stop layer 112 and the second etch stop layer 114 are made of different materials. In some embodiments, the first etch stop layer 112 is formed of a first dielectric material, such as silicon carbide, and the second etch stop layer 114 is formed of a second dielectric material, such as aluminum oxide. The silicon carbide layer may be used as a glue layer to improve adhesion between the aluminum oxide layer and the inter-metal dielectric layer 108. In some embodiments, the second etch stop layer 114 is thinner than the first etch stop layer 112.

A dielectric layer 116 is formed over the second etch stop layer 114, as shown in FIG. 1A in accordance with some embodiments. In some embodiments, the dielectric layer 116 is made of any applicable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The dielectric layer 116 may be formed by any applicable deposition process, such as spin coating, physical vapor deposition (PVD), chemical vapor deposition (CVD), the like, or a combination thereof. The dielectric layer 116 may be a layer made of a low-k dielectric material having a k-value lower than about 3.0. The dielectric layer 116 may be a layer made of an extra-low-k (ELK) dielectric material having a k-value of less than 2.5.

Afterwards, conductive structures 118 are formed through the dielectric layer 116, the second etch stop layer 114, and the first etch stop layer 112, as shown in FIG. 1B in accordance with some embodiments. The conductive structures 118 may also be referred to as conductive vias or bottom vias. In some embodiments, the conductive structures 118 include conductive barrier layers 120 and conductive layers 122. The conductive barrier layers 120 may line the sidewalls and the bottom surfaces of the conductive layer 122.

In some embodiments, the conductive barrier layers 120 are formed of titanium, titanium nitride, tantalum, tantalum nitride, cobalt, a combination thereof, or the like. In some embodiments, the conductive layers 122 are formed of metals such as copper, aluminum, tungsten, cobalt, alloys thereof, or the like. The formation of the conductive structures 118 may include etching the dielectric layer 116, the second etch stop layer 114, and the first etch stop layer 112 to form via openings, forming a blanket conductive barrier layer extending into the via openings, depositing a metallic material over the blanket conductive barrier layer, and performing a planarization process, such as a CMP process or a mechanical grinding process, to remove excess portions of the blanket conductive barrier layer and the metallic material.

Next, a bottom electrode layer 124 is formed over the dielectric layer 116, as shown in FIG. 1C in accordance with some embodiments. In some embodiments, the bottom electrode layer 124 is made of conductive materials such as TaN, TiN, Ti/TiN, TaN/TiN, Ta, Cu, Al, Ti, W, Pt, Ni, Cr, Ru, combinations thereof, multilayers thereof, or the like. The bottom electrode layer 124 may be formed as a blanket layer and may be formed using CVD, physical vapor deposition (PVD), electro-chemical plating (ECP), electroless plating, or the like. In some embodiments, the bottom electrode layer 124 has a thickness in a range from about 20 Å to about 150 Å.

After the bottom electrode layer 124 is formed, a MTJ stack 126 is formed over the bottom electrode layer 124, as shown in FIG. 1C in accordance with some embodiments. In some embodiments, the MTJ stack 126 includes a pinner layer 128, a tunnel barrier layer 130, and a free layer 132.

In some embodiments, the pinned layer 128 is formed of a ferromagnetic material, such as cobalt iron (CoFe), cobalt iron boron (CoFeB), a combination thereof, or the like. In some embodiments, the pinned layer 128 has a thickness in a range from about 50 Å to about 100 Å. The pinned layer 128 may have a synthetic ferromagnetic (SFM) structure, in which the coupling between magnetic layers is ferromagnetic coupling. The pinned layer 118B may also adopt a synthetic antiferromagnetic (SAF) structure including a plurality of magnetic metal layers separated by a plurality of non-magnetic spacer layers. The magnetic metal layers may be formed of Co, Fe, Ni, or the like. The non-magnetic spacer layers may be formed of Cu, Ru, Ir, Pt, W, Ta, Mg, or the like. For example, the pinned layer 128 may have a Co layer and repeated (Pt/Co)x layers over the Co layer, with x representing repeating number that can be any integer equal to or greater than 1, such as 20. The pinned layer 128 may be deposited using one or more deposition methods such as, CVD, PVD, ALD, a combination thereof, or the like.

In some embodiments, the tunnel barrier layer 130 is formed of a dielectric material, such as MgO, AlO, AlN, a combination thereof, or the like. In some embodiments, the tunnel barrier layer 130 has a thickness in the range from about 0.5 nm to about 3 nm. The tunnel barrier layer 130 may be deposited using one or more deposition methods such as, CVD, PVD, ALD, a combination thereof, or the like.

In some embodiments, the free layer 132 is formed of a ferromagnetic material such as CoFe, NiFe, CoFeB, CoFeBW, a combination thereof, or the like. The free layer 132 may also adopt a synthetic ferromagnetic structure, which is similar to a SAF structure, with the thickness of the non-magnetic spacer layers adjusted to achieve the ferromagnetic coupling between the separated magnetic metals, e.g., causing the magnetic moment to be coupled in the same direction. The magnetic moment of the free layer 132 is programmable, and the resistances of the resulting MTJ stacks is accordingly programmable. Specifically, the resistances of the resulting MTJ stacks can be changed between a high resistance (Rap) and a low resistance (Rp) based on the programmed magnetic moment of the free layer 132. As such, the resulting MTJ stacks can also be referred to as programmable resistance elements or programmable resistors. The thickness of the tunnel barrier layer 132 contributes to the Rap and the Rp of the resulting MTJ stacks. The free layer 132 may be deposited using one or more deposition methods such as, CVD, PVD, ALD, a combination thereof, or the like.

It should be noted that the materials and the structure of the MTJ film stack 118 may have many variations, which are also within the scope of the present disclosure. For example, an anti-ferromagnetic layer (not shown) may be formed before the pinned layer 128 is formed, so the pinned layer 128 is formed over the anti-ferromagnetic layer. The anti-ferromagnetic layer may be formed of a metal alloy including manganese (Mn) and one or more other metal(s) such as platinum (Pt), iridium (Ir), rhodium (Rh), nickel (Ni), palladium (Pd), iron (Fe), osmium (Os), or the like. For example, the anti-ferromagnetic layer can be formed of PtMn, IrMn, RhMn, NiMn, PdPtMn, FeMn, OsMn, or the like. The anti-ferromagnetic layer may have a thickness in a range of about 50 Å to about 200 Å. The anti-ferromagnetic layer may be deposited using one or more deposition methods such as, CVD, PVD, ALD, a combination thereof, or the like.

After the MTJ stack 126 is formed, a top electrode layer 134 is formed over the MTJ stack 126, as shown in FIG. 1C in accordance with some embodiments. The top electrode layer 134 may be formed as a blanket layer and may be formed using CVD, PVD, ECP, electroless plating, or the like. In some embodiments, the top electrode layer 134 is made of TiN, Ta, TaN, Ti, Ru, W, WC, Ru, Al, Cu, alloys thereof, or the like. In some embodiments, the top electrode layer 134 is formed of titanium nitride. In some embodiments, the top electrode layer 134 has a thickness in the range of about 400 Å to about 1500 Å. The top electrode layer 120 may be used as a hard mask in the subsequent patterning of the MTJ film stack 118.

Next, mask structures 136 are formed over the top electrode layer 134, as shown in FIG. 1D in accordance with some embodiments. In some embodiments, the mask structures 136 are formed of an oxide such as titanium oxide, silicon oxide, a combination thereof, or the like. The mask structures 136 may be formed by forming a mask layer over the top electrode layer 134, forming a photosensitive layer over the mask layer, and patterning the mask layer through the photosensitive layer to form the mask structures 136. The photosensitive mask may be a photoresist, such as a single-layer photoresist, a bi-layer photoresist, a tri-layer photoresist, or the like.

After the mask structures 136 are formed, an ion beam etching process 138 is performed to etch the top electrode layer 134, so that top electrode structures 134' are formed, as shown in FIG. 1E in accordance with some embodiments. In some embodiments, the upper portions of the mask structures 136 are also removed during the ion beam etching process 138. In some embodiments, the ion beam etching process 138 includes using an etching gas such as Ar, He, Ne, Kr, Xe, Rn, MeOH, $O_2$, $N_2$, $H_2$, or $CO_x$, and x is a positive integral. In some embodiments, the etching gas is a noble gas, such as Kr.

In some embodiments, the plasma of the etching gas is injected to the top electrode layer at an angle $\theta_1$ in a range from about 10 degrees to about 75 degrees in the ion beam etching process 138. In some embodiments, the ion beam etching process 138 is performed at a temperature in a range from about 25° C. to about 60° C. In some embodiments, the ion beam etching process 138 is performed under an etching bias voltage in a range from about 100V to about 1500V. In some embodiments, the ion beam etching process 138 is performed under a RF power lower than 1500 W.

After the ion beam etching process 138 is performed, a trimming process 140 is performed to treat the top electrode structures 134', as shown in FIG. 1F in accordance with some embodiments. In some embodiments, the etching gas used in the trimming process 140 is the same as that used in the ion beam etching process 138, but the plasma inject angle and the etching bias voltage are different. In some embodiments, the plasma of the etching gas is injected at an angle $\theta_2$ in a range from about 30 degrees to about 65 degrees. In some embodiments, the trimming process 140 is performed under an etching bias voltage lower than that of the ion beam etching process 138. In some embodiments, the trimming process 140 is performed under an etching bias voltage in a range from about 25V to about 100V.

Next, an ion beam etching process 142 is performed to etch the free layer 132, so that free layer structures 132' are formed, as shown in FIG. 1G in accordance with some embodiments. In some embodiments, the upper portions of the mask structures 136 are also removed during the ion beam etching process 142. In some embodiments, the ion beam etching process 142 includes using an etching gas such as Ar, He, Ne, Kr, Xe, Rn, MeOH, $O_2$, $N_2$, $H_2$, or $CO_x$, and x is a positive integral. In some embodiments, the etching gas is a noble gas, such as Kr.

The etching gas used in the ion beam etching process 142 may be chosen according to the material the free layer 132 is made of. Generally, during an ion beam etching process, the material layer may be physically bombarded by the plasma of the etching gas, and some materials removed from the original location may be re-deposited to the neighboring structures, resulting lowering the sputtering yield of the ion beam etching process. In addition, if the amount of the re-deposited is too high, the electrical and magnetic performance of the resulting device may also be undermined. Accordingly, the etching gas used in the ion beam etching process 142 may be chosen to have an atomic mass or molecular mass that is close to the molecular mass of the material of the free layer 132, so the etching efficiency of the ion beam etching process 142 may be improved.

In some embodiments, the ion beam etching process 142 includes using an etching gas formed of a first element having the first atomic mass, and the difference between the first atomic mass of the first element and the molecular mass of the material of the free layer 132 is lower than 40. In some embodiments, the difference between the first atomic mass of the first element and the molecular mass of the material of the free layer 132 is lower than 30. In some embodiments, the ion beam etching process 142 includes using an etching gas formed of a first compound having a first molecular mass, and the difference between the first molecular mass of the first compound and the molecular mass of the material of the free layer 132 is lower than 40. In some embodiments, the difference between the first molecular mass of the first compound and the molecular mass of the material of the free layer 132 is lower than 30.

If the atomic mass of the etching gas is too small (compared to the material of the free layer 132), the ions of the etching gas may penetrate into the free layer 132 and therefore damaging the crystal structure of the free layer 132. On the other hand, if the atomic mass of the etching gas is too large, the crystal structure of the free layer 132 may also be damaged as the ions bombard the surface of the free layer 132, and the electrical and magnetic performance may therefore be undermined.

In some embodiments, the plasma of the etching gas is injected to the free layer 132 at an angle $\theta_3$ in a range from about 10 degrees to about 75 degrees in the ion beam etching process 142. In some embodiments, the ion beam etching process 142 is performed at a temperature in a range from about 25° C. to about 60° C. In some embodiments, the ion beam etching process 142 is performed under an etching bias voltage in a range from about 100V to about 1500V. In some embodiments, the ion beam etching process 142 is performed under a RF power lower than 1500 W.

After the ion beam etching process 142 is performed, a trimming process 144 is performed to treat the free layer structures 132', as shown in FIG. H in accordance with some embodiments. In some embodiments, the etching gas used in the trimming process 144 is the same as that used in the ion beam etching process 142, but the plasma inject angle and the etching bias voltage are different. In some embodiments, the plasma of the etching gas is injected at an angle $\theta_4$ in a range from about 30 degrees to about 65 degrees. In some embodiments, the trimming process 144 is performed under an etching bias voltage lower than that of the ion beam etching process 142. In some embodiments, the trimming process 144 is performed under an etching bias voltage in a range from about 25V to about 100V.

Next, an ion beam etching process 146 is performed to etch the tunnel barrier layer 130, so that tunnel barrier layer structures 130' are formed, as shown in FIG. 1I in accordance with some embodiments. In some embodiments, the upper portions of the mask structures 136 are also removed during the ion beam etching process 146. In some embodiments, the ion beam etching process 146 includes using an etching gas such as Ar, He, Ne, Kr, Xe, Rn, MeOH, $O_2$, $N_2$, $H_2$, or $CO_x$, and x is a positive integral. In some embodiments, the etching gas used in the ion beam etching process 146 is the same as that used in the ion beam etching process 142. In some embodiments, the difference between the atomic mass of the element of the etching gas used in the ion beam etching process 146 and a molecular mass of the material of the tunnel barrier layer 130 is greater than the difference between the atomic mass of the element of the etching gas used in the ion beam etching process 142 and the molecular mass of the material of the free layer 132. In some embodiments, the etching rate of the tunnel barrier layer 130 in the ion beam etching process 146 is lower than the etching rate of the free layer 132 in the ion beam etching process 142.

In some embodiments, the plasma of the etching gas is injected to the top electrode layer at an angle $\theta_5$ in a range from about 10 degrees to about 75 degrees in the ion beam etching process 146. In some embodiments, the ion beam etching process 146 is performed at a temperature in a range from about 25° C. to about 60° C. In some embodiments, the ion beam etching process 146 is performed under an etching bias voltage in a range from about 100V to about 1500V. In some embodiments, the ion beam etching process 146 is performed under a RF power lower than 1500 W.

After the ion beam etching process 146 is performed, a trimming process 148 is performed to treat the tunnel barrier layer structures 130', as shown in FIG. 1J in accordance with some embodiments. In some embodiments, the etching gas used in the trimming process 148 is the same as that used in the ion beam etching process 146, but the plasma inject angle and the etching bias voltage are different. In some embodiments, the plasma of the etching gas is injected at an angle $\theta_6$ in a range from about 30 degrees to about 65 degrees. In some embodiments, the trimming process 148 is performed under an etching bias voltage lower than that of the ion beam etching process 146. In some embodiments, the trimming process 148 is performed under an etching bias voltage in a range from about 25V to about 100V.

After the tunnel barrier layer structure 130' is formed, an ion beam etching process 150 is performed to etch the pinned layer 128, so that pinned layer structures 128' are formed, as shown in FIG. 1K in accordance with some embodiments. In some embodiments, the upper portions of the mask structures 136 are also removed during the ion beam etching process 150. In some embodiments, the ion beam etching process 152 includes using an etching gas such as Ar, He, Ne, Kr, Xe, Rn, MeOH, $O_2$, $N_2$, $H_2$, or $CO_x$, and x is a positive integral. In some embodiments, the etching gas is a noble gas, such as Kr.

Similarly, the etching gas used in the ion beam etching process 152 may be chosen according to the material the pinned layer 128 is made of. More specifically, the etching gas may be chosen to have an atomic mass or molecular mass that is close to the molecular mass of the material of the pinned layer 128, so the etching efficiency of the ion beam etching process 150 may be improved.

In some embodiments, the ion beam etching process 150 includes using an etching gas formed of a first element having the first atomic mass, and the difference between the first atomic mass of the first element and the molecular mass of the material of the pinned layer 128 is lower than 40. In some embodiments, the difference between the first atomic mass of the first element and the molecular mass of the material of the pinned layer 128 is lower than 30. In some embodiments, the ion beam etching process 150 includes using an etching gas formed of a first compound having a first molecular mass, and the difference between the first molecular mass of the first compound and the molecular mass of the material of the pinned layer 128 is lower than 40. In some embodiments, the difference between the first molecular mass of the first compound and the molecular mass of the material of the pinned layer 128 is lower than 30.

Similar to those described previously, if the atomic mass of the etching gas is too small, the ion of the etching gas may penetrate into the pinned layer 132 and therefore damaging the crystal structure of the pinned layer 132. On the other hand, if the atomic mass of the etching gas is too large, the crystal structure of the pinned layer 132 may also be damaged as the ions bombard the surface of the pinned layer 132. Therefore, the electrical and magnetic performance may be undermined as the crystal structure of the pinned layer 132 is damaged.

In some embodiments, the plasma of the etching gas is injected to the top electrode layer at an angle $\theta_7$ in a range from about 10 degrees to about 75 degrees in the ion beam etching process 150. In some embodiments, the ion beam etching process 150 is performed at a temperature in a range from about 25° C. to about 60° C. In some embodiments, the ion beam etching process 150 is performed under an etching bias voltage in a range from about 100V to about 1500V. In some embodiments, the ion beam etching process 150 is performed under a RF power lower than 1500 W.

After the ion beam etching process 150 is performed, a trimming process 152 is performed to treat the pinned layer structure 128', as shown in FIG. 1L in accordance with some embodiments. In some embodiments, the etching gas used in the trimming process 152 is the same as that used in the ion beam etching process 150, but the plasma inject angle and the etching bias voltage are different. In some embodiments, the plasma of the etching gas is injected at an angle $\delta_8$ in a range from about 30 degrees to about 65 degrees. In some embodiments, the trimming process 152 is performed under an etching bias voltage lower than that of the ion beam etching process 150. In some embodiments, the trimming process 144 is performed under an etching bias voltage in a range from about 25V to about 100V.

As shown in FIG. 1L, MTJ stack structures 126' are formed, and the MTJ stack structures 126' include the free layer structures 132', the tunnel barrier layer structures 130', and the pinned layer structures 128' in accordance with some embodiments. As described above, the etching gas used in the ion beam etching processes for patterning the structure may be chosen according to their materials, the damage and re-deposition issues may be reduced, and the performance of the resulting MTJ stack structures 126' may be improved.

After the MTJ stack structures 126' are formed, an ion beam etching process 154 is performed to etch the bottom electrode layer 124, so that bottom electrode structures 124' are formed, as shown in FIG. 1M in accordance with some embodiments. In addition, the mask structures 136 is completely consumed, and the top portions of the top electrode structures 134' is also slightly etched during the ion beam etching process 154 in accordance with some embodiments. In some embodiments, the top electrode structures 134' have rounded corners after the ion beam etching process 154 is performed. In some other embodiments, the mask structures 136 is completely consumed in previous processes (e.g. the ion beam etching processes 138, 142, 146, and 150).

As shown in FIG. 1M, the dielectric layer 116 is also etched during the ion beam etching process 154 to form recesses in the etched dielectric layer 116' in accordance with some embodiments. In some embodiments, the dielectric layer 116' has curved top surfaces after the ion beam etching process 154 is performed.

In some embodiments, the ion beam etching process 154 includes using an etching gas such as Ar, He, Ne, Kr, Xe, Rn, MeOH, $O_2$, $N_2$, $H_2$, or $CO_x$, and x is a positive integral. In some embodiments, the etching gas is a noble gas, such as Ar.

In some embodiments, the etching gas used in the ion beam etching process 154 is different from the etching gases used in at least one of the ion beam etching processes 138, 142, 146, and 150. In some embodiments, the atomic mass of the etching gas used in the ion beam etching process 154 is smaller than the atomic mass of the etching gas used in at least one of the ion beam etching processes 138, 142, 146, and 150.

In some embodiments, the etching gas used in the ion beam etching process 154 is different from the etching gas used in the ion beam etching process 138. In some embodiments, the etching gas used in the ion beam etching process 154 is different from the etching gas used in the ion beam etching process 142.

In some embodiments, the plasma of the etching gas is injected to the bottom electrode layer 124 at an angle $\theta_9$ in a range from about 10 degrees to about 75 degrees in the ion beam etching process 154. In some embodiments, the ion beam etching process 154 is performed at a temperature in a range from about 25° C. to about 60° C. In some embodiments, the ion beam etching process 154 is performed under an etching bias voltage in a range from about 100V to about 1500V. In some embodiments, the ion beam etching process 154 is performed under a RF power lower than 1500 W.

After the ion beam etching process 154 is performed, a trimming process 156 is performed to treat the bottom electrode structures 124', as shown in FIG. 1N in accordance with some embodiments. In some embodiments, the etching gas used in the trimming process 156 is the same as that used in the ion beam etching process 154, but the plasma inject angle and the etching bias voltage are different. In some embodiments, the plasma of the etching gas is injected at an angle $\theta_{10}$ in a range from about 30 degrees to about 65 degrees. In some embodiments, the trimming process 156 is performed under an etching bias voltage lower than that of the ion beam etching process 154. In some embodiments, the trimming process 156 is performed under an etching bias voltage in a range from about 25V to about 100V.

It should be noted that some of the etching processes and trimming processes described may be omitted or altered. In some embodiments, the trimming processes 144, and 148 are omitted. In some embodiments, the etching gas used in the ion beam etching processes 142, 146, and 150 are the same. In some embodiments, at least two of the etching gases used in the ion beam etching processes 138, 142, 146, 150, and 154 are different. In some embodiments, the ion beam etching processes 138, 142, 146, 150, and 154 and the trimming processes 140, 144, 148, 152, and 156 are performed in the same chamber, but the etching gases applied thereto are changed.

Figure 2:
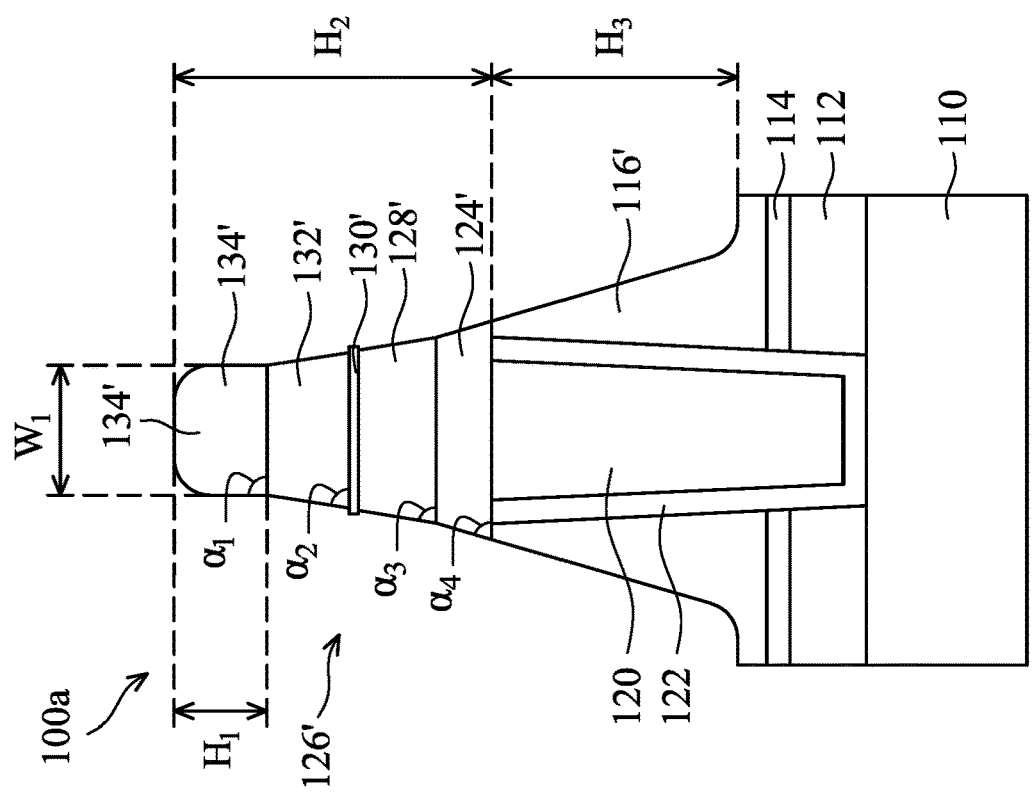
FIG. 2 illustrates an enlarged view of the semiconductor structure shown in the region R in FIG. 1N in accordance with some embodiments.

FIG. 2 illustrates an enlarged view of the semiconductor structure 100a shown in the region R in FIG. 1N in accordance with some embodiments. As described previously, the etching gas are chosen according to the materials, so the sputtering yield of the ion beam etching processes 138, 142, 146, 150, and 154 can be improved and the damage and re-deposition issues can be reduced. In addition, the profile of the resulting structures can also be adjusted accordingly.

As shown in FIG. 2, the top electrode structures 134', the free layer structure 132', the tunnel barrier layer structure 130', the pinned layer structure 128', and the bottom electrode structure 124' have sloped sidewalls in accordance with some embodiments. In some embodiments, the inclination of the sloped sidewall of the bottom electrode structure 124' is different from the inclination of the sloped sidewall of the pinned layer structure 128'.

In addition, the tunnel barrier layer structure 130' laterally protrudes from the bottom portion of the sidewall of the free layer structure 132' and the top portion of the sidewall of the pinned layer structure 128' in accordance with some embodiments. In some embodiments, the width $W_1$ of the tunnel barrier layer structure 130' is in a range from about 30 nm to about 100 nm. The tunnel barrier layer structure 130' should not be too wide or the resistance of the device may be too high. On the other hand, the tunnel barrier layer structure 130' still need to be wide enough to maintain its magnetic performance. In some embodiments, the tunnel barrier layer structure 130' is wider than the top surface of the conductive structure 118.

In some embodiments, the height $H_1$ of the top electrode structure 134' is in a range from about 100 Å to about 500 Å. In some embodiments, the height $H_2$ of the pillar structure, including the top electrode structure 130', the free layer structure 132', the tunnel barrier layer structure 130', the pinned layer structure 128', and the bottom electrode structure 124', is in a range from about 400 Å to about 900 Å. In some embodiments, the height $H_3$ of the recess in the dielectric layer 116' is in a range from about 50 Å to about 800 Å.

In some embodiments, an angle $\alpha_1$ between the sidewall and the bottom surface of the top electrode structure 134' is greater than an angle $\alpha_2$ between the sidewall and the bottom surface of the free layer structure 132'. In some embodiments, an angle $\alpha_2$ between the sidewall and the bottom surface of the free layer structure 132' is substantially equal to an angle $\alpha_3$ between the sidewall and the bottom surface of the pinned layer structure 128'. In some embodiments, an angle $\alpha_4$ between the sidewall and the bottom surface of the bottom electrode structure 124' is smaller than an angle $\alpha_3$ between the sidewall and the bottom surface of the pinned layer structure 128'.

In some embodiments, an angle $\alpha_1$ is in a range from about 70 degrees to about 90 degrees. In some embodiments, the angle $\alpha_{2b}$ and the angle $\alpha_{3b}$ are both in a range of about 70 degrees to about 85 degrees. In some embodiments, an angle $\alpha_4$ is in a range from about 30 degrees to about 85 degrees.

After the top electrode layer 134, the free layer 132, the tunnel barrier layer 130, the pinned layer 128, and the bottom electrode layer 124 are patterned, spacers 140 are formed around the top electrode structure 134', the MTJ stack structures 126', and the bottom electrode structures 124', as shown in FIG. 1O in accordance with some embodiments. The spacers 140 may include one or more dielectric materials such as silicon oxide ($SiO_x$), silicon nitride ($SiN_x$), silicon oxynitride ($Si_xO_yN_z$), or the like. The spacers 140 may include one or multiple layers of the dielectric materials in various embodiments.

The spacers 140 may be formed by depositing a blanket dielectric layer covering the top electrode structure 134', the MTJ stack structures 126', the bottom electrode structures 124', and the dielectric layer 116' using CVD, ALD, or any applicable methods and then anisotropically etching the blanket dielectric layer to form the spacers 140.

Next, a protection layer 142 is conformally formed to cover the spacers 140, and a dielectric layer 144 is formed over the protection layer 142, as shown in FIG. 1P in accordance with some embodiments. The protection layer 142 may be formed using ALD and then the dielectric layer 144 is formed using ALD. In some embodiments, the protection layer 142 is made of a metal-based oxide, such as alumina ($Al_2O_3$). In some embodiments, the dielectric layer 144 is made of a dielectric material that is different from the material in the dielectric layer 116'. For example, the dielectric layer 144 may include a nitride based dielectric material such as silicon carbonitride.

Afterwards, the dielectric layer 144, the protection layer 142, the dielectric layer 116', and the second etch stop layer 114 are patterned, as shown in FIG. 1P in accordance with some embodiments. More specifically, the dielectric layer 144, the protection layer 142, the dielectric layer 116', and the second etch stop layer 114 at the logic region 20 are removed by performing one or more etching processes, and the first etch stop layer 112 at the logic region 20 is exposed, as shown in FIG. 1P in accordance with some embodiments.

Next, a dielectric layer 146 is formed over the first etch stop layer 112 at the logic region 20, and conductive structures 148 are formed through the dielectric layer 146 and the first etch stop layer 112, as shown in FIG. 1Q in accordance with some embodiments.

In some embodiments, the dielectric layer 146 is made of any applicable dielectric material, for example, a nitride such as silicon nitride; an oxide such as silicon oxide, phosphosilicate glass (PSG), borosilicate glass (BSG), boron-doped phosphosilicate glass (BPSG), or the like; or the like. The dielectric layer 146 may be formed by any applicable deposition process, such as spin coating, physical vapor deposition (PVD), chemical vapor deposition (CVD), the like, or a combination thereof. The dielectric layer 146 may be a layer made of a low-k dielectric material having a k-value lower than about 3.0. The dielectric layer 146 may be a layer made of an extra-low-k (ELK) dielectric material having a k-value of less than 2.5.

After the dielectric layer 146 is formed, trenches are formed through the dielectric layer 146 to expose the conductive features 110 embedded in the inter-metal dielectric layer 108, and the conductive structures 148 are formed in the trenches, as shown in FIG. 1Q in accordance with some embodiments.

In some embodiments, the conductive structures 148 are made of a conductive material including aluminum (Al), copper (Cu), tungsten (W), titanium (Ti), tantulum (Ta), titanium nitride (TiN), cobalt, tantalum nitride (TaN), nickel silicide (NiS), cobalt silicide (CoSi), copper silicide, tantulum carbide (TaC), tantulum silicide nitride (TaSiN), tantulum carbide nitride (TaCN), titanium aluminide (TiAl), titanium aluminum nitride (TiAlN), other applicable conductive materials, or a combination thereof.

The conductive structures 148 may further include a liner and/or a barrier layer. For example, a liner (not shown) may be formed on the sidewalls and bottom of the trenches. The liner may be made of silicon nitride, although any other applicable dielectric may be used as an alternative. The liner may be formed using a plasma enhanced chemical vapor deposition (PECVD) process, although other applicable processes, such as physical vapor deposition or a thermal process, may be used as an alternative. The barrier layer (not shown) may be formed over the liner (if present) and may cover the sidewalls and bottom of the trenches. The barrier layer may be formed using a process such as chemical vapor deposition (CVD), physical vapor deposition (PVD), plasma enhanced CVD (PECVD), plasma enhanced physical vapor deposition (PEPVD), atomic layer deposition (ALD), or any other applicable deposition processes. The barrier layer may be made of tantalum nitride, although other materials, such as tantalum, titanium, titanium nitride, or the like, may also be used.

After the conductive material is formed, a planarization process is performed to remove the excess conductive material to form the conductive structures 148, as shown in FIG. 1Q in accordance with some embodiments. In some embodiments, a portion of the top electrode structures 134', the spacers 140, the protection layer 142, and the dielectric layer 144 are also slightly removed by the planarization process. The planarization process may be a CMP process, a mechanical grinding process, or the like.

In some embodiments, a pitch P between two neighboring pillars is in a range from about 50 nm to about 200 nm. The pitch P should be great enough so the etching processes described above can be performed more efficiently. On the other hand, the pitch P should not be too large or the resulting device would have a greater size.

Figure 3A:
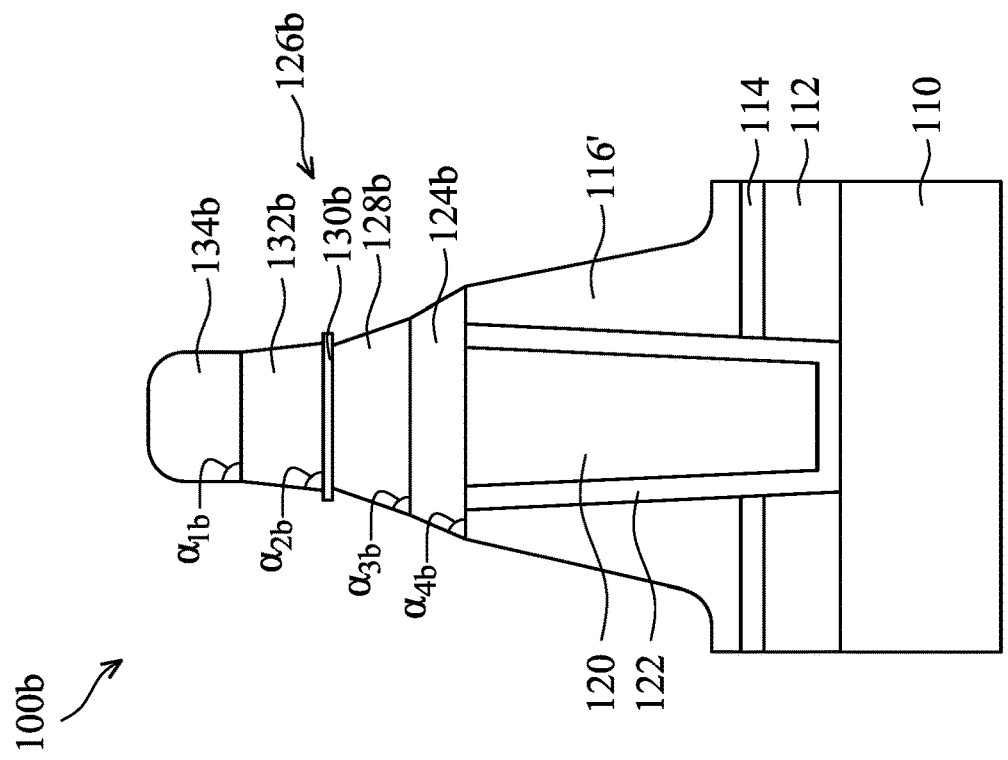
FIGS. 3A, 4A, and 5A illustrate intermediate semiconductor structures in accordance with some embodiments.
Figure 5A:
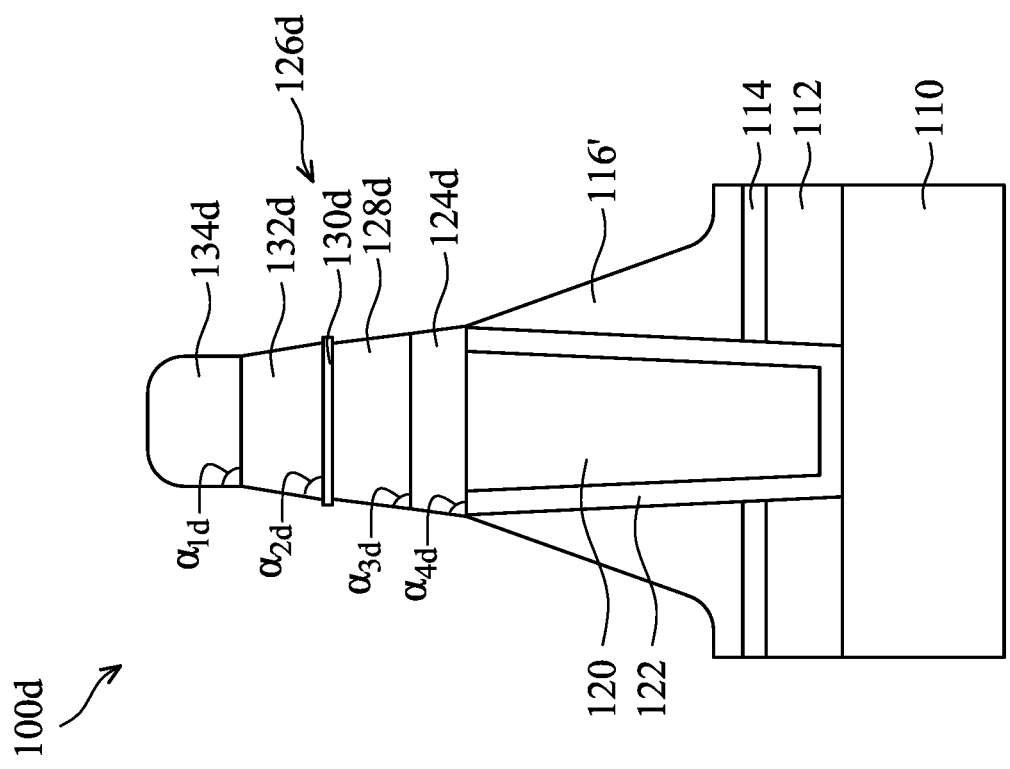
Figure 4A:
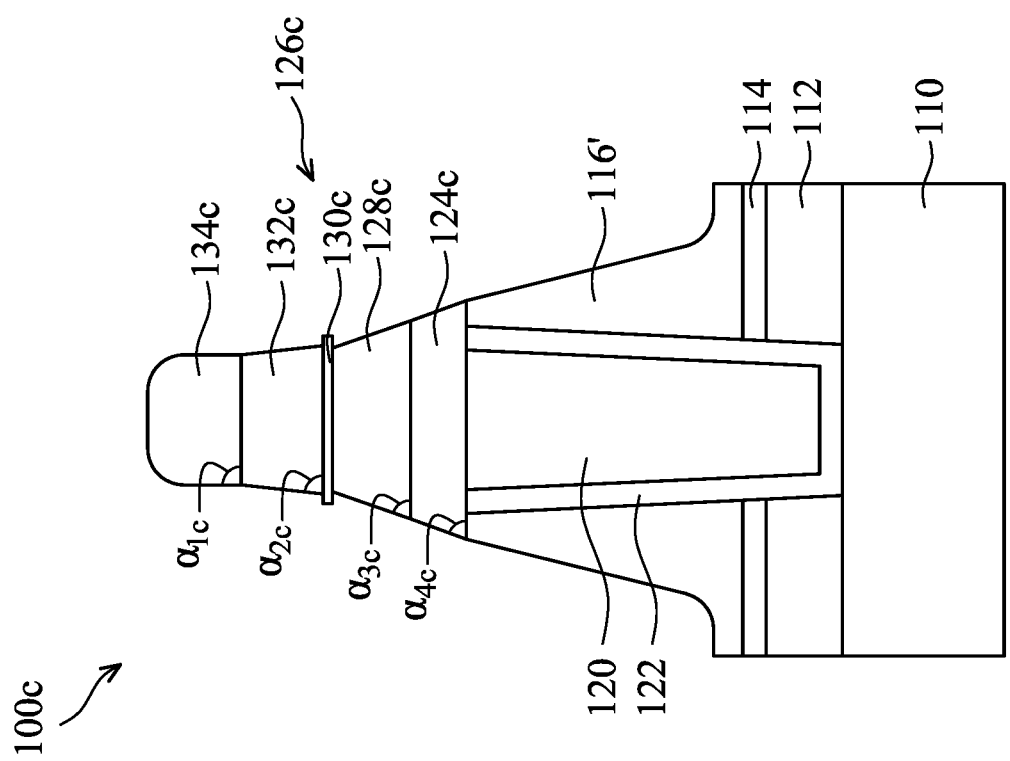

FIGS. 3A, 4A, and 5A illustrate intermediate semiconductor structures 100b, 100c, and 100d in accordance with some embodiments. The semiconductor structures 100b, 100c, and 100d may be the same as the semiconductor structure 100a shown in FIG. 2, except the shapes of each layer are different. The shapes of the semiconductor structures 100b, 100c, and 100d may be adjusted by choosing different etching gases during the ion beam etching processes 138, 142, 146, 150, and 154 as described previously.

Materials and processes for manufacturing the intermediate semiconductor structures 100b, 100c, and 100d may be similar to, or the same as, those for manufacturing the semiconductor structure 100a described above and are not repeated herein. For examples, the processes for forming the top electrode structures 134b, 134b, and 134d, the free layer structures 132b, 132c, and 132d, the tunnel barrier layer structures 130b, 130c, and 130d, the pinned layer structures 128b, 128c, and 128d, and the bottom electrode structures 124b, 124c, and 124d are similar to, or the same as, those for forming the top electrode structures 134', the free layer structures 132', the tunnel barrier layer structures 130', the pinned layer structures 128', and the bottom electrode structures 124'.

Figure 3B:
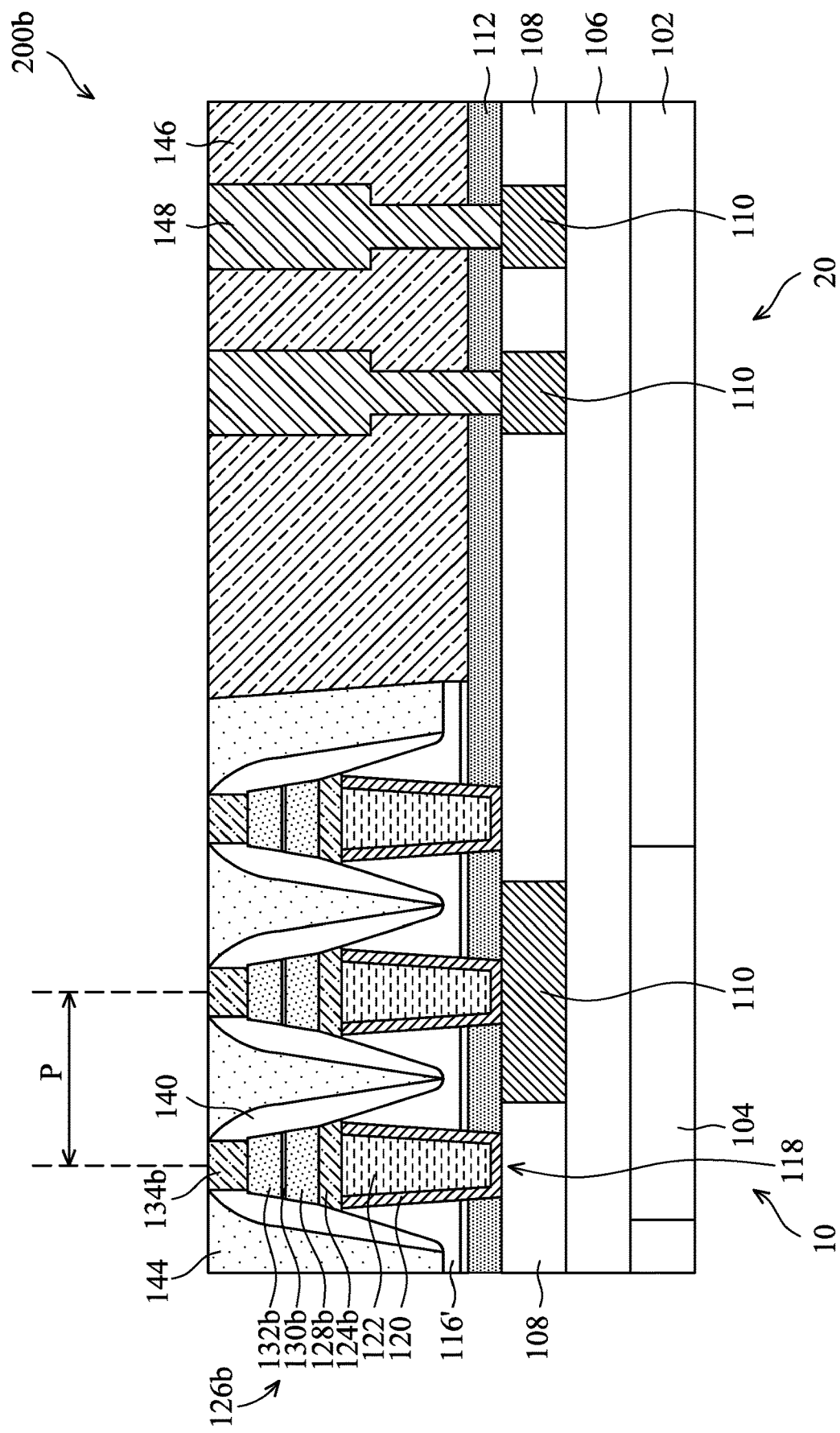
FIGS. 3B, 4B, and 5B illustrate cross-sectional views of the semiconductor structures in accordance with some embodiments.
Figure 4B:
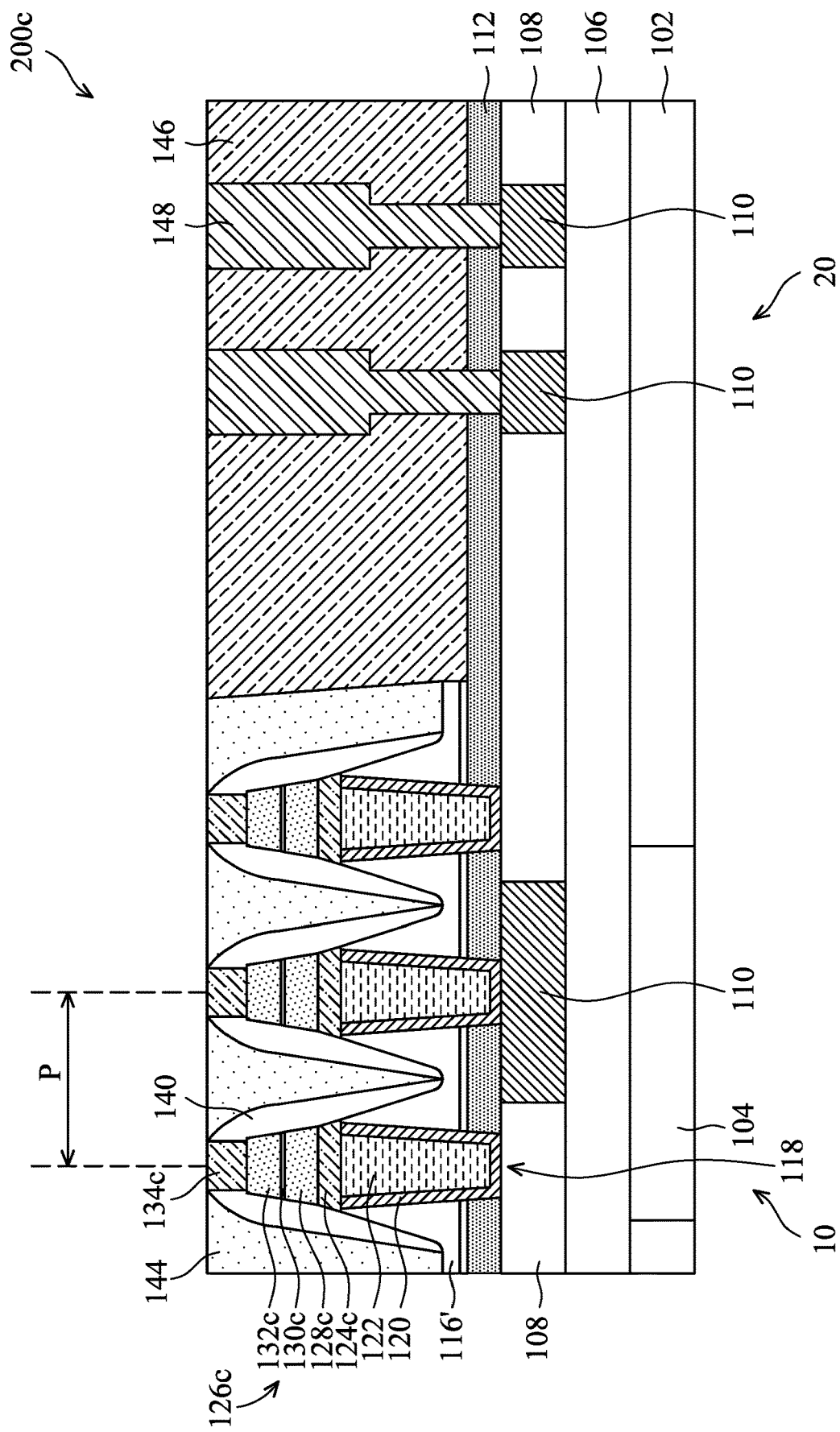
Figure 5B:
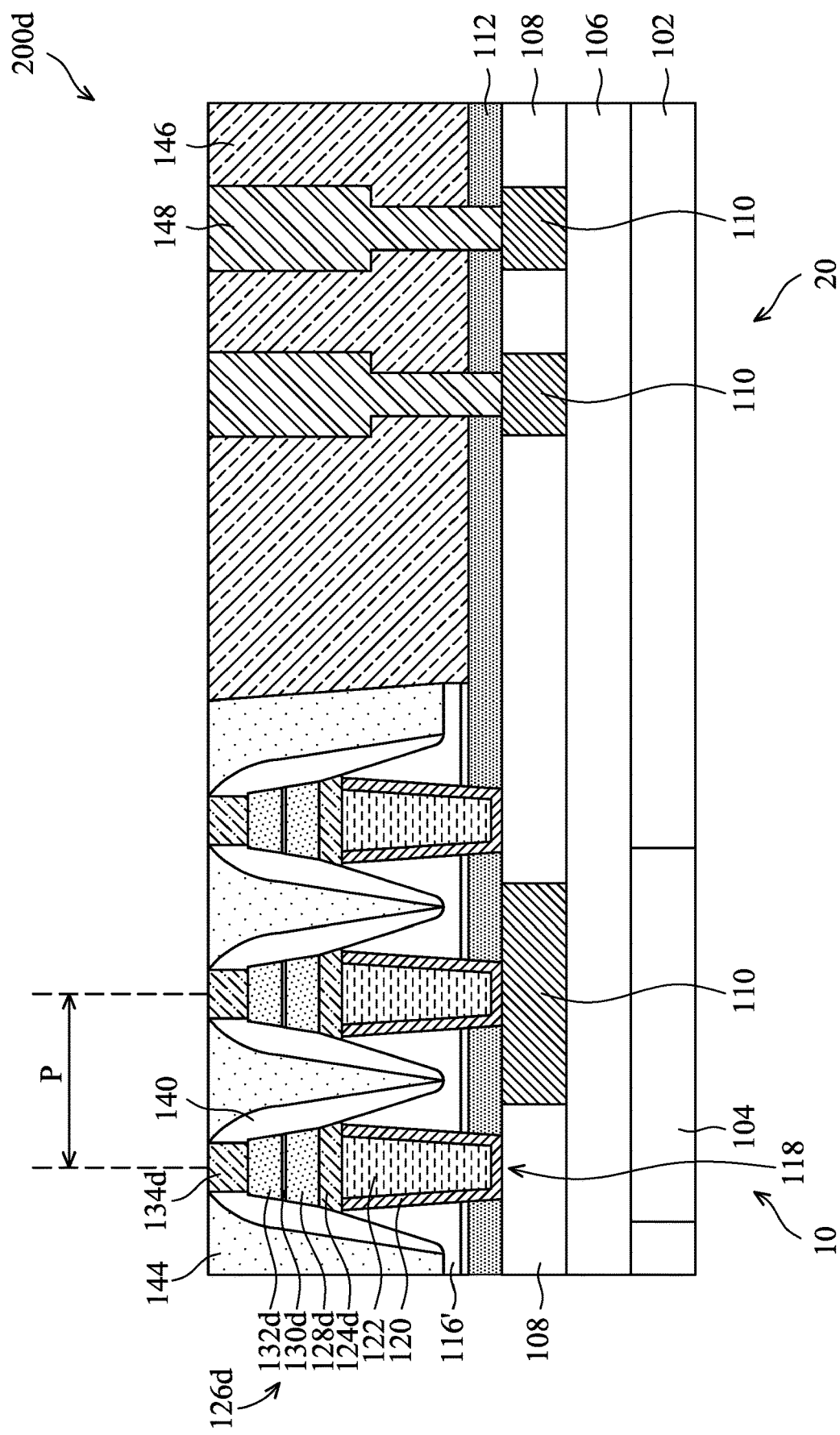

In addition, the processes shown in FIGS. 1O to 1Q and described previously may also be performed after forming the semiconductor structures 100b, 100c, and 100d, so that semiconductor structures 200b, 200c, and 200d are formed, as shown in FIGS. 3B, 4B, and 5B in accordance with some embodiments. Similar or the same elements in FIGS. 1A to 1Q, 2, 3A, 3B, 4A, 4B, 5A, and 5B are designated by the same numerals. Further, similar or the same elements in FIGS. 1A to 1Q, 2, 3A, 3B, 4A, 4B, 5A, and 5B can include similar or the same materials and can be formed by similar or the same steps; therefore such redundant details are omitted in the interest of brevity.

Similar to FIG. 2, the top electrode structures 134b, 134c, and 134d, the free layer structures 132b, 132c, and 132d, the tunnel barrier layer structures 130b, 130c, and 130d, the pinned layer structures 128b, 128c, and 128d, and the bottom electrode structures 124b, 124c, and 124d have sloped sidewalls in accordance with some embodiments. In addition, the tunnel barrier layer structures 130b, 130c, and 130d laterally protrudes from the sidewall of the free layer structures 132b, 132c, and 132d and the sidewall of the pinned layer structures 128b, 128c, and 128d in accordance with some embodiments.

As shown in FIGS. 3A and 3B, the semiconductor structure 100b is the same as the semiconductor structure 100b, except an angle $\alpha_{2b}$ between the sidewall and the bottom surface of the free layer structure 132b is greater than an angle $\alpha_{3b}$ between the sidewall and the bottom surface of the pinned layer structure 128b in accordance with some embodiments. That is, the angle $\alpha_{1b} > \alpha_{2b} > \alpha_{3b} > \alpha_{4b}$ in accordance with some embodiments.

As shown in FIGS. 3A and 3B, the semiconductor structure 100b is the same as the semiconductor structure 100a, except an angle $\alpha_{2b}$ between the sidewall and the bottom surface of the free layer structure 132b is greater than an angle $\alpha_{3b}$ between the sidewall and the bottom surface of the pinned layer structure 128b in accordance with some embodiments. That is, the angle $\alpha_{1b} > \alpha_{2b} > \alpha_{3b} > \alpha_{4b}$ in accordance with some embodiments.

As shown in FIGS. 4A and 4B, the semiconductor structure 100c is the same as the semiconductor structure 100b, except an angle $\alpha_{3c}$ between the sidewall and the bottom surface of the pinned layer structure 128c is substantially equal to an angle $\alpha_{4c}$ between the sidewall and the bottom surface of the bottom electrode structure 124c in accordance with some embodiments. That is, the angle $\alpha_{1b} > \alpha_{2b} > \alpha_{3b} = \alpha_{4b}$ in accordance with some embodiments. In some embodiments, the angle $\alpha_{3c}$ and the angle $\alpha_{4c}$ are both in a range of about 30 degrees to about 85 degrees.

As shown in FIGS. 4A and 4B, the semiconductor structure 100c is the same as the semiconductor structure 100b, except an angle $\alpha_{3c}$ between the sidewall and the bottom surface of the pinned layer structure 128c is substantially equal to an angle $\alpha_{4c}$ between the sidewall and the bottom surface of the bottom electrode structure 124c in accordance with some embodiments. That is, the angle $\alpha_{1c} > \alpha_{2c} > \alpha_{3c} = \alpha_{4c}$ in accordance with some embodiments. In some embodiments, the angle $\alpha_{3c}$ and the angle $\alpha_{4c}$ are both in a range of about 30 degrees to about 85 degrees.

As shown in FIGS. 5A and 5B, the semiconductor structure 100c is the same as the semiconductor structure 100b, except an angle $\alpha_{2d}$ between the sidewall and the bottom surface of the free layer structure 132d is smaller than an angle $\alpha_{3d}$ between the sidewall and the bottom surface of the pinned layer structure 128d in accordance with some embodiments. That is, the angle $\alpha_{1d} > \alpha_{2d} < \alpha_{3d} = \alpha_{4d}$ in accordance with some embodiments. In some embodiments, the angle $\alpha_{3d}$ and the angle $\alpha_{4d}$ are in a range of about 70 degrees to about 85 degrees.

In some embodiments, the etching gases used in the ion beam etching processes (e.g. the ion beam etching processes 138, 142, 146, 150, and 154) are chosen according to the materials that are going to be etched. That is, different etching gases may be used in different ion beam etching processes. By using the etching gas having the atomic mass close to that of the materials (e.g. MTJ stacks), the energy-transfer efficiency of the ion beam can be increased. Therefore, the sputtering yield of the can be improved. In addition, by choosing the according to the materials of the MTJ stacks, the dame of the crystal structures of the MTJ stacks due to the ion bombardment and the re-deposition issues can also be reduced.

In some embodiments, the trimming processes (e.g. the trimming processes 140, 144, 148, 152, and 156) are performed after the ion beam etching processes and may be used to remove the re-deposition materials and adjust the profile of the pillar structures. Therefore, the performance, such as the magnetic properties, of the resulting semiconductor structures (e.g. the semiconductor structures 200, 200b, 200c, and 200d) can be improved.

Embodiments for forming semiconductor structures may be provided. The semiconductor structure may include a magnetic tunnel junction (MTJ) stack structure including a pinned layer structure, a tunnel barrier layer structure, and a free layer structure. The MTJ stack structure may be formed by patterning a MTJ stack including a pinned layer, a tunnel barrier layer, and a free layer using ion beam etching processes. Etching gases used in the ion beam etching processes may be chosen according to the materials of the MTJ stack, so that the sputtering yield of the ion beam etching processes may be improved. Accordingly, the performance of the semiconductor structure can also be improved.

In some embodiments, a method for manufacturing a semiconductor structure is provided. The method for manufacturing the semiconductor structure includes forming a bottom electrode layer over a substrate and forming a pinned layer over the bottom electrode layer. The method for manufacturing the semiconductor structure also includes forming a tunnel barrier layer over the pinned layer and forming a free layer over the tunnel barrier layer. The method for manufacturing the semiconductor structure also includes patterning the free layer, the tunnel barrier layer, and the pinned layer to form a magnetic tunnel junction (MTJ) stack structure and patterning the bottom electrode layer to form a bottom electrode structure under the MTJ stack structure. In addition, patterning the free layer includes using a first etching gas, and patterning the bottom electrode layer includes using a second etching gas, which is different from the first etching gas.

In some embodiments, a method for manufacturing a semiconductor structure is provided. The method for manufacturing a semiconductor structure includes forming a pinned layer over a substrate and forming a tunnel barrier layer over the pinned layer. The method for manufacturing a semiconductor structure also includes forming a free layer over the tunnel barrier layer, and the free layer is made of a first material. The method for manufacturing a semiconductor structure also includes etching the free layer to form a free layer structure by performing a first ion beam etching process. In addition, the first ion beam etching process includes using a first etching gas, and the first etching gas is formed of a first element having a first atomic mass, and the difference between the first atomic mass of the first element and the molecular mass of the first material is lower than 40. Alternatively, the first etching gas is formed of a first compound having a first molecular mass, and the difference between the first molecular mass of the first compound and the molecular mass of the first material is lower than 40.

In some embodiments, a semiconductor structure is provided. The semiconductor structure includes a bottom electrode structure formed over a substrate and a magnetic tunnel junction (MTJ) stack structure formed over the bottom electrode structure. The MTJ stack structure includes a pinned layer structure formed over the bottom electrode structure, and the pinned layer structure has a first sloped sidewall. The MTJ stack structure also includes a tunnel barrier layer structure formed over the pinned layer structure and a free layer structure formed over the tunnel barrier layer structure. The semiconductor structure further includes a top electrode structure formed over the MTJ stack structure. In addition, the tunnel barrier layer structure laterally protrudes from a top portion of the first sloped sidewall of the pinned layer structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:
   forming a bottom electrode layer over a substrate;
   forming a pinned layer over the bottom electrode layer;
   forming a tunnel barrier layer over the pinned layer;
   forming a free layer over the tunnel barrier layer;
   patterning the free layer, the tunnel barrier layer, and the pinned layer to form a free layer structure, a tunnel barrier layer structure, and a pinned layer structure of a magnetic tunnel junction (MTJ) stack structure; and
   patterning the bottom electrode layer to form a bottom electrode structure under the MTJ stack structure,
   wherein a bottom surface of the tunnel barrier layer structure is narrower than a bottom surface of the bottom electrode structure but is wider than a top surface of the pinned layer structure,
   wherein patterning the free layer comprises using a first etching gas, and patterning the bottom electrode layer comprises using a second etching gas, which is different from the first etching gas.

2. The method for manufacturing the semiconductor structure as claimed in claim 1, wherein the first etching gas and the second etching gas are both noble gases.

3. The method for manufacturing the semiconductor structure as claimed in claim 1, wherein the first etching gas is formed of a first element having a first atomic mass, the second etching gas is formed of a second element having a second atomic mass, and the first atomic mass is greater than the second atomic mass.

4. The method for manufacturing the semiconductor structure as claimed in claim 1, further comprising:
treating the MTJ stack structure by performing a first trimming process,
wherein the free layer is patterned by performing a first ion beam etching process, and the first etching gas is used in both the first ion beam etching process and the first trimming process.

5. The method for manufacturing the semiconductor structure as claimed in claim 4, wherein the first ion beam etching process is performed under a first etching bias voltage, the first trimming process is performed under a first trimming bias voltage, and the first etching bias voltage is greater than the first trimming bias voltage.

6. The method for manufacturing the semiconductor structure as claimed in claim 1, further comprising:
treating the bottom electrode structure by performing a second trimming process,
wherein the bottom electrode layer is patterned by performing a second ion beam etching process, and the second etching gas is used in both the second ion beam etching process and the second trimming process.

7. A method for manufacturing a semiconductor structure, comprising:
forming a pinned layer over a substrate;
forming a tunnel barrier layer over the pinned layer;
forming a free layer over the tunnel barrier layer, wherein the free layer is made of a first material; and
etching the free layer, the tunnel barrier layer, and the pinned layer to form a magnetic tunnel junction (MTJ) stack structure comprising a free layer structure, a tunnel barrier layer structure, and a pinned layer structure by performing a first ion beam etching process,
wherein the first ion beam etching process comprises using a first etching gas, and the first etching gas is formed of a first compound having a first molecular mass, wherein a difference between the first molecular mass of the first compound and a molecular mass of the first material is lower than 40, and
wherein the tunnel barrier layer structure is wider than a top surface of the pinned layer structure.

8. The method for manufacturing the semiconductor structure as claimed in claim 7, wherein the first etching gas is MeOH or $CO_x$, and x is a positive integral.

9. The method for manufacturing the semiconductor structure as claimed in claim 7,
wherein a first etching rate of the free layer is greater than a second etching rate of the tunnel barrier layer during the first ion beam etching process.

10. The method for manufacturing the semiconductor structure as claimed in claim 9, further comprising:
forming a bottom electrode layer over the substrate; and
etching the bottom electrode layer to form a bottom electrode structure under the MTJ stack structure by performing a second ion beam etching process,
wherein a second etching gas is used in the second ion beam etching process and is different from the first etching gas.

11. The method for manufacturing the semiconductor structure as claimed in claim 10, further comprising:
forming a dielectric layer over the substrate;
forming a conductive structure in the dielectric layer; and
etching the dielectric layer to form a curved top surface by performing the second ion beam etching process.

12. A method for manufacturing a semiconductor structure, comprising:
sequentially forming a bottom electrode layer, a pinned layer, a tunnel barrier layer, and a free layer over a substrate;
patterning the free layer to form a free layer structure having a first sloped sidewall;
etching the tunnel barrier layer to form a tunnel barrier layer structure below the free layer structure;
etching the pinned layer to form a pinned layer structure having a second sloped sidewall below the tunnel barrier layer structure;
etching the bottom electrode layer to form a bottom electrode structure having a third sloped sidewall below the pinned layer structure; and
forming a spacer over the first sloped sidewall of the free layer structure, the second sloped sidewall of the pinned layer structure, and the third sloped sidewall of the bottom electrode structure,
wherein a protruding portion of the tunnel barrier layer structure laterally protrudes from the first sloped sidewall and the second sloped sidewall and extending into the spacer, and the spacer is in contact with both a top surface and a bottom surface of the protruding portion of the tunnel barrier layer.

13. The method for manufacturing the semiconductor structure as claimed in claim 12, wherein an inclination of the first sloped sidewall of the free layer structure is different from an inclination of the second sloped sidewall of the pinned layer structure.

14. The method for manufacturing the semiconductor structure as claimed in claim 12, wherein an inclination of the second sloped sidewall of the pinned layer structure is different from an inclination of the third sloped sidewall of the bottom electrode structure.

15. The method for manufacturing the semiconductor structure as claimed in claim 12, further comprising:
forming a dielectric layer over the substrate;
forming a conductive structure through the dielectric layer; and
etching the dielectric layer to form a fourth sloped sidewall connecting the third sloped sidewall of the bottom electrode structure.

16. The method for manufacturing the semiconductor structure as claimed in claim 15, further comprising:
forming a top electrode structure having a fifth sidewall over the free layer, wherein the spacer partially covering the fifth sidewall and fully covering the fourth sloped sidewall.

17. The method for manufacturing the semiconductor structure as claimed in claim 1, further comprising:
forming a spacer in contact with a top surface and the bottom surface of the tunnel barrier layer structure and a sidewall of the pinned layer structure.

18. The method for manufacturing the semiconductor structure as claimed in claim 9, wherein a sidewall surface and a bottom surface of the free layer structure form a first angle, a sidewall surface and a bottom surface of the pinned layer structure form a second angle, and the first angle is greater than the second angle.

19. The method for manufacturing the semiconductor structure as claimed in claim 12, wherein the spacer is in direct contact with the first sloped sidewall of the free layer structure, the second sloped sidewall of the pinned layer structure, and the third sloped sidewall of the bottom electrode structure.

20. The method for manufacturing the semiconductor structure as claimed in claim 10, wherein a bottom surface of the pinner structure and a top surface of the bottom electrode structure have substantially a same width, and a bottom surface of the bottom electrode structure is wider than a top surface of the bottom electrode.

* * * * *